United States Patent
Kim et al.

(10) Patent No.: US 9,871,681 B2
(45) Date of Patent: *Jan. 16, 2018

(54) BI-PHASED ON-OFF KEYING (OOK) TRANSMITTER AND COMMUNICATION METHOD

(71) Applicant: SAMSUNG ELECTRONICS CO., LTD., Suwon-si (KR)

(72) Inventors: Seongjoong Kim, Hwaseong-si (KR); Yongkyu Kim, Hwaseong-si (KR); Chang-soon Park, Chungju-si (KR); Young-jun Hong, Seoul (KR); Seok-ju Yun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/412,803

(22) Filed: Jan. 23, 2017

(65) Prior Publication Data

US 2017/0134197 A1    May 11, 2017

Related U.S. Application Data

(63) Continuation of application No. 15/016,566, filed on Feb. 5, 2016, now Pat. No. 9,621,197.

(30) Foreign Application Priority Data

Mar. 10, 2015  (KR) .................. 10-2015-0032951
Aug. 5, 2015  (KR) .................. 10-2015-0110586

(51) Int. Cl.
*H04L 27/04* (2006.01)
*H03F 1/02* (2006.01)
*H03F 3/24* (2006.01)

(52) U.S. Cl.
CPC ............ *H04L 27/04* (2013.01); *H03F 1/02* (2013.01); *H03F 3/24* (2013.01)

(58) Field of Classification Search
CPC .................................... H03F 1/02; H03F 3/24
(Continued)

(56) References Cited

U.S. PATENT DOCUMENTS 5,875,212 A    2/1999  Fleek et al.
6,310,869 B1 *  10/2001  Holtzman ............ H04B 1/707
                                          370/335

(Continued)

FOREIGN PATENT DOCUMENTS

JP    08-223119 A    8/1996
JP    8-274829 A    10/1996
(Continued)

*Primary Examiner* — Leila Malek
(74) *Attorney, Agent, or Firm* — NSIP Law

(57) ABSTRACT

An on-off keying (OOK) transmitter and communication method are provided. The OOK transmitter may include a data encoder configured to encode input data into a transmission sequence, a pulse shaper configured to generate pulses based on the transmission sequence, a bi-phase controller configured to generate a control signal to control a random change in phase, between two phases, of a carrier based on the transmission sequence, a bi-phased switch configured to randomly change a phase of the carrier generated by a voltage-controlled oscillator (VCO), based on the control signal, and a power amplifier (PA) configured to generate a transmission signal based on the generated pulses and the carrier with the randomly changed phase. The PA may be a bi-phasing PA, and the bi-phased switch may be included in the bi-phasing PA.

4 Claims, 26 Drawing Sheets

(58) Field of Classification Search
USPC .......................... 375/295, 298, 300; 455/91
See application file for complete search history.

(56) References Cited

U.S. PATENT DOCUMENTS

| | | | |
|---|---|---|---|
| 6,420,940 B1 | 7/2002 | Minnis et al. | |
| 8,222,965 B1 * | 7/2012 | Juneau | H03C 3/0916 |
| | | | 331/1 A |
| 8,774,317 B2 | 7/2014 | Eliezer | |
| 9,065,716 B1 * | 6/2015 | Bynum | G08G 5/0013 |
| 2003/0147472 A1 | 8/2003 | Bach et al. | |
| 2005/0084052 A1 | 4/2005 | Paille | |
| 2006/0193401 A1 | 8/2006 | Lopez Villegas et al. | |
| 2008/0013445 A1 | 1/2008 | Siwiak et al. | |
| 2013/0163697 A1 | 6/2013 | Moser | |
| 2014/0355727 A1 | 12/2014 | Xu et al. | |
| 2014/0369444 A1 | 12/2014 | Park et al. | |

FOREIGN PATENT DOCUMENTS

| | | |
|---|---|---|
| JP | 8-321820 A | 12/1996 |
| JP | 10-190611 A | 7/1998 |
| JP | 2004-241859 A | 8/2004 |
| JP | 2005-094194 A | 4/2005 |
| JP | 10-0520491 B1 | 1/2006 |
| JP | 2008-211782 A | 9/2008 |
| JP | 2008-236417 A | 10/2008 |
| KR | 1993-0005646 B1 | 6/1993 |
| KR | 1993-0012023 B1 | 12/1993 |
| KR | 10-0253415 B1 | 4/2000 |
| KR | 10-2000-0024783 A | 5/2000 |
| KR | 10-0742105 B1 | 7/2007 |
| KR | 10-2007-0119045 A | 12/2007 |
| KR | 10-1195778 B1 | 10/2012 |
| KR | 10-2014-0146436 A | 12/2014 |

* cited by examiner

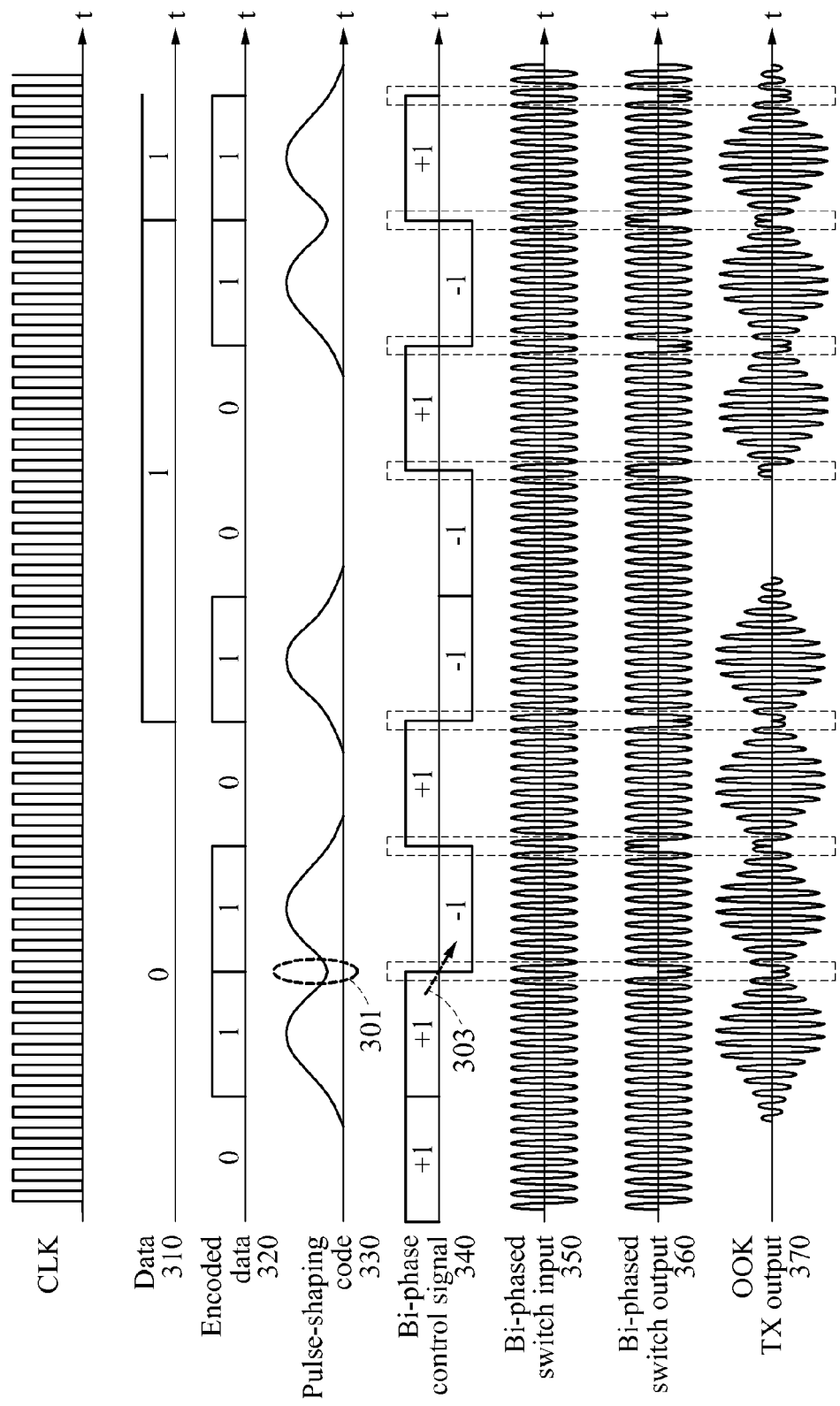

BI-PHASED ON-OFF KEYING (OOK) TRANSMITTER AND COMMUNICATION METHOD

CROSS-REFERENCE TO RELATED APPLICATION(S)

This application is a Continuation application of U.S. application Ser. No. 15/016,566, filed Feb. 5, 2016, which claims the benefit under 35 USC 119(a) of Korean Patent Application Korean Patent Application No. 10-2015-0032951 and Korean Patent Application No. 10-2015-0110586, respectively filed on Mar. 10, 2015 and Aug. 5, 2015 in the Korean Intellectual Property Office, the entire disclosures of which are all incorporated herein by reference for all purposes.

BACKGROUND

1. Field

One or more embodiments relate to a bi-phased on-off keying (OOK) transmitter and communication method.

2. Description of Related Art

As only an example, a wearable device based on a wireless body area network (WBAN) may be attached to a human body, and may wirelessly communicate with a neighboring mobile device or a sensor attached to the human body. To increase a period of time during which the wearable device can operate, e.g., without a burden of a battery charge, a transceiver may be implemented with a low complexity and designed to operate at low power. For example, an ultra low power radio frequency (RF) structure and a transceiver having a low modulation complexity of a modem may be available. As another example, an on-off keying (OOK) transceiver capable of recovering data by detecting an envelope instead of using phase information of a received carrier may be used in such low power communication in a WBAN.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

One or more embodiments provide an on-off keying (OOK) transmitter including a data encoder configured to encode input data into a transmission sequence, a pulse shaper configured to selectively generate respective pulses based on each of plural bits of the transmission sequence, a bi-phase controller configured to generate a control signal to control a random change in phase, between two phases, of a carrier based on a periodicity of elements in the transmission sequence, a bi-phased switch configured to randomly change a phase of the carrier based on the control signal, the carrier being generated by a voltage-controlled oscillator (VCO), and a power amplifier (PA) configured to generate a transmission signal based on the generated pulses and the carrier with the randomly changed phase.

The bi-phased switch may be configured to randomly change the phase of the carrier between 0 degrees and 180 degrees.

The data encoder may be configured to encode the input data into plural predetermined sequence patterns.

The bi-phase controller may generate the control signal so as to change the phase of the carrier at least once during transmission of each of the plural encoded sequence patterns of the transmission sequence.

The bi-phase controller may be configured to adjust the control signal so as to initiate plural phase changes of the carrier during a transmission of an encoded sequence pattern of the transmission sequence.

The OOK transmitter may further include a first buffer configured to buffer the carrier generated by the VCO, to reduce effects of the generated control signal on a frequency of the carrier, before the carrier is provided to the bi-phased switch.

The OOK transmitter may further include a second buffer configured to buffer the carrier with the randomly changed phase, to reduce effects of operations of the PA on the VCO, before the carrier with the randomly changed phase is provided to the PA.

The PA may be a bi-phasing PA, with the bi-phased switch being included in the bi-phasing PA.

One or more embodiments provide an on-off keying (OOK) transmitter including a data encoder configured to encode input data into a transmission sequence, a pulse shaper configured to generate pulses based on the transmission sequence, a bi-phase controller configured to generate a control signal to control a random change in phase, between two phases, of a carrier based on a periodicity of elements in the transmission sequence, and a bi-phasing power amplifier (PA) configured to randomly change a phase of the carrier based on the control signal, and to generate a transmission signal corresponding to the generated pulses and the carrier with the randomly changed phase, the carrier being generated by a voltage-controlled oscillator (VCO).

The bi-phasing PA may be configured to randomly change the phase of the carrier every period of the transmission sequence, based on the control signal.

The bi-phasing PA may be configured to randomly change the phase of the carrier between 0 degrees and 180 degrees every period of the transmission sequence, based on the control signal.

The data encoder may be configured to encode the input data into plural predetermined sequence patterns, each encoded sequence pattern representing a different period of the transmission sequence.

The bi-phase controller may be configured to adjust the control signal so as to initiate plural phase changes of the carrier during a period of the transmission sequence.

The OOK transmitter may further include a first buffer configured to buffer the carrier generated by the VCO, to reduce effects of the generated control signal on a frequency of the carrier, before the carrier is provided to the bi-phasing PA.

The OOK transmitter may further include a second buffer configured to buffer an output of the first buffer, to reduce effects of operations of the PA on the VCO, before the carrier is provided to the bi-phasing PA.

One or more embodiments provide an on-off keying (OOK) transmitter including a buffer configured to buffer a carrier, generated by a voltage-controlled oscillator (VCO), to reduce effects of operations of a bi-phase power amplifier (PA) on the VCO, and the bi-phasing PA configured to randomly change a phase of the buffered carrier based on a control signal and to generate a transmission signal corresponding to generated pulses, the pulses being generated based on a transmission sequence obtained by an encoding of data.

The bi-phasing PA may be configured to randomly change the phase of the buffered carrier between 0 degrees and 180 degrees every period of the transmission sequence, based on the control signal.

One or more embodiments provide a communication method including encoding input data into a transmission sequence, generating pulses based on the transmission sequence, generating a control signal to control a random change in phase, between two phases, of a carrier based on the transmission sequence, controlling a bi-phased switch to randomly change a phase of the carrier based on the control signal, the carrier being generated by a voltage-controlled oscillator (VCO), and generating a transmission signal based on the generated pulses and the carrier with the randomly changed phase.

The controlling of the bi-phased switch to randomly change the phase of the carrier may include controlling the bi-phased switch to randomly change the phase of the carrier between 0 degrees and 180 degrees at least once every period of the transmission sequence, based on the control signal, based on the control signal.

The communication method may further include buffering the carrier generated by the VCO to reduce effects of the generated control signal on a frequency of the carrier.

One or more embodiments provide a communication method including encoding input data into a transmission sequence, generating pulses based on the transmission sequence, generating a control signal to control a random change in phase, between two phases, of a carrier based on the transmission sequence, and controlling a bi-phasing power amplifier (PA) to randomly change a phase of the carrier based on the control signal and to generate a transmission signal based on the carrier with the randomly changed phase and the generated pulses, the carrier being generated by a voltage-controlled oscillator (VCO).

The controlling of the bi-phasing PA to randomly change the phase of the carrier may include controlling the bi-phasing PA to randomly change the phase of the carrier between 0 degrees and 180 degrees at least once every period of the transmission sequence, based on the control signal.

The controlling of the bi-phasing PA to randomly change the phase of the carrier may include controlling a bi-phased switch of the bi-phasing PA to perform the random changing of the phase of the carrier.

Other features and aspects will be apparent from the following detailed description, the drawings, and the claims.

BRIEF DESCRIPTION OF THE DRAWINGS

FIG. 3 is a timing diagram illustrating an operation of an OOK transmitter, according to one or more embodiments.

Figure 1A:
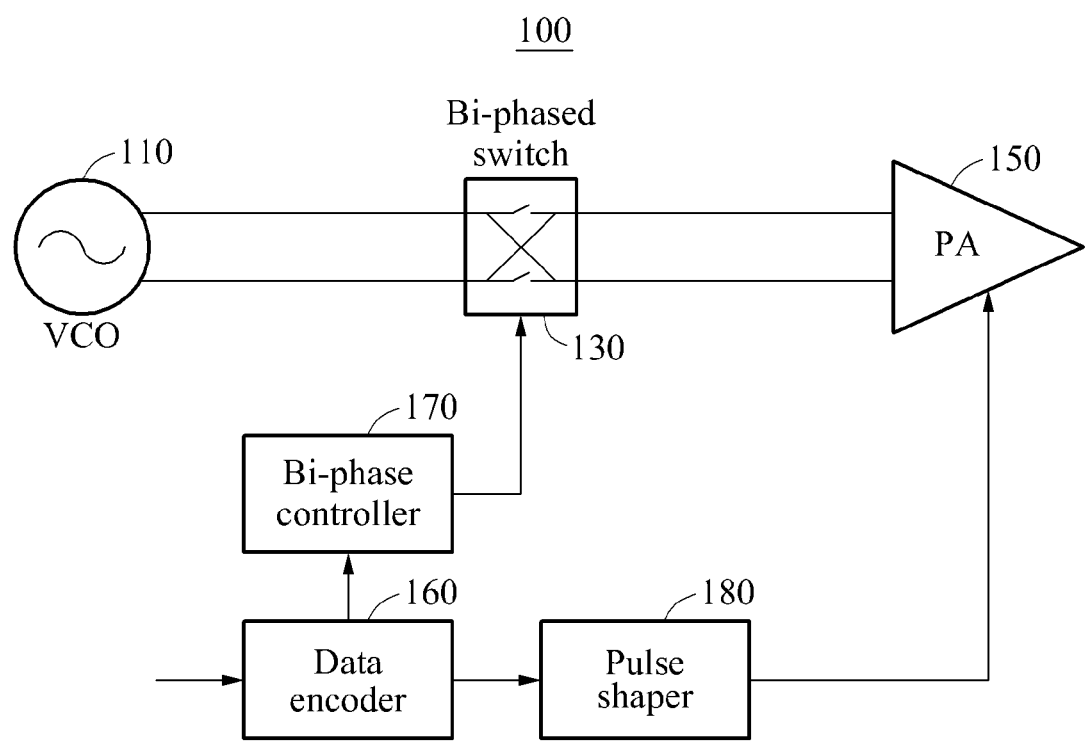
FIGS. 1A through 1D are block diagrams respectively illustrating an on-off keying (OOK) transmitter including a bi-phased switch, according to one or more embodiments.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent, after an understanding of the present disclosure, to one of ordinary skill in the art, with the exception of operations necessarily occurring in a certain order. Also, descriptions of functions and constructions that may be well known to one of ordinary skill in the art, after an understanding of the present disclosure, may be omitted for increased clarity and conciseness.

Various alterations and modifications may be made to embodiments, some of which will be illustrated in detail in the drawings and detailed description. However, it should be understood that these embodiments are not construed as limited to the disclosure and illustrated forms and should be understood to include all changes, equivalents, and alternatives within the idea and the technical scope of this disclosure.

Terms used herein are to merely explain specific embodiments, thus it is not meant to be limiting. A singular expression includes a plural expression except when two expressions are contextually different from each other. For example, as used herein, the singular forms "a", "an", and "the" are intended to include the plural forms as well, unless the context clearly indicates otherwise. Herein, a term "include" or "have" are also intended to indicate that characteristics, figures, operations, components, or elements disclosed on the specification or combinations thereof exist. The term "include" or "have" should be understood so as not to pre-exclude existence of one or more other characteristics, figures, operations, components, elements or combinations thereof or additional possibility.

Unless otherwise defined, all terms including technical and scientific terms used herein have the same meaning as commonly understood by one of ordinary skill in the art to which respective embodiments belong. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

When describing the examples with reference to the accompanying drawings, like reference numerals refer to like constituent elements and a repeated description related thereto will be omitted. When it is determined detailed description related to a related known function or configuration they may make a purpose of an embodiment unnecessarily ambiguous in describing the embodiment, such a detailed description will be omitted.

FIGS. 1A through 1D are diagrams respectively illustrating an on-off keying (OOK) transmitter 100 including a bi-phased switch 130, according to one or more embodiments.

Referring to FIG. 1A, the OOK transmitter 100 may include a voltage-controlled oscillator (VCO) 110, the bi-phased switch 130, a power amplifier (PA) 150, a data encoder 160, a bi-phase controller 170, and a pulse shaper 180, for example. The VCO 110 generates a carrier. In other words, the VCO 110 outputs a radio frequency (RF) oscillation signal corresponding to a carrier frequency.

The carrier generated by the VCO 110 may be OOK-modulated in the PA 150 based on a signal in which data is encoded and that is received from the data encoder 160 through the pulse shaper 180.

The bi-phased switch 130 may randomly change a phase of the carrier generated by the VCO 110 based on a control signal generated by the bi-phase controller 170. The bi-phased switch 130 may randomly change the phase of the carrier based on a unit of time of each element in a transmission sequence obtained through encoding, based on the control signal. In embodiments, the "unit of time of each element in the transmission sequence" is understood to mean, for example, a time required to transmit an element "0" or "1" included in the sequence {0, 1, 1, 0}, such as of a transmission sequence 320 corresponding to "0" in data 310 in FIG. 3, or a similar time representing the transmission time of each element "0" or "1" in a particular sequence in the transmission sequence 320. For example, the bi-phased switch 130 may implement the random changes in phase so that any randomly implemented change occurs in accordance with the periodicity of the elements of the transmission sequence 320, e.g., so that a change in phase may occur at the same time as a timed element transition in the transmission sequence 320, noting that a period of the transmission sequence 320 may have a different length of time corresponding to the time between the beginning and ending of each encoded bit sequences or symbols of the transmission sequence 320, as only examples. For example, a bi-phased switch will be described in greater detail with reference to FIGS. 2A and 2B.

To suppress a line spectrum, the bi-phased switch 130 may randomly change the phase of the carrier by 0 degrees or 180 degrees in the unit of time of each element in the transmission sequence. An example in which the phase of the carrier output from the VCO 110 is randomly changed by 0 degrees or 180 degrees by the bi-phased switch 130 is illustrated in FIG. 3. The bi-phased switch 130 is located between the VCO 110 and the PA 150. The OOK transmitter 100 randomly changes the phase of the carrier using the bi-phased switch 130, and performs bi-phasing so that the carrier has two phases, for example, 0 degrees and 180 degrees. The bi-phased switch 130 may randomly select either 0 degrees or 180 degrees as the phase of the carrier based on the control signal generated by the bi-phase controller 170.

The PA 150 generates a transmission signal based on the carrier with the phase changed through the bi-phased switch 130 and a pulse generated by the pulse shaper 180. The carrier, the pulse and the transmission signal may correspond to, for example, an output 360 of a bi-phased switch, a pulse 330, and a transmission signal 370 of an OOK transmitter of FIG. 3, respectively. The PA 150 individually controls 15, for example, unit cells based on a signal received from the pulse shaper 180 to be powered on or off, to perform an OOK modulation of the carrier.

The data encoder 160 encodes an input data sequence to a transmission sequence using a conversion scheme provided in advance in a corresponding system. For example, the data encoder 160 may encode a data sequence provided in a digital baseband in a predetermined sequence pattern with digital values. In an example, the data encoder 160 may encode an input data sequence of "1" to a transmission sequence of "1" without a change, and encode an input data sequence of "0" to a transmission sequence of "0" without a change. In another example, the data encoder 160 may encode an input data sequence of "1" to a transmission sequence corresponding to [1,0,0,1], and encode an input data sequence of "0" to a transmission sequence corresponding to [0,1,1,0]. In still another example, when an input data sequence includes "M" elements, different transmission sequences, each including "L" elements, may be mapped to different input data sequences.

In above examples, in an embodiment, the data encoder 160 may use an element selected from a set $\{-1, 0, 1\}$ as an element of the transmission sequence, which may correspond to ternary sequence spreading with three types of elements in a transmission sequence.

The bi-phase controller 170 may generate a control signal to randomly change a phase of the carrier by one of two phases, for example 0 degrees and 180 degrees, based on the transmission sequence output from the data encoder 160. A bi-phase shift by the control signal generated by the bi-phase controller 170 may be implemented by synchronization with an output of the data encoder 160.

To enhance a spectrum efficiency, the pulse shaper 180 may generate a pulse (for example, the pulse 330 of FIG. 3) corresponding to the input data (for example, the data 310 of FIG. 3) based on the transmission sequence (for example, a transmission sequence 320 of FIG. 3) output from the data encoder 160. The pulse generated by the pulse shaper 180 may have, for example, a shape of a pulse quantized and implemented by a digital pulse shaping filter.

Figure 1B:
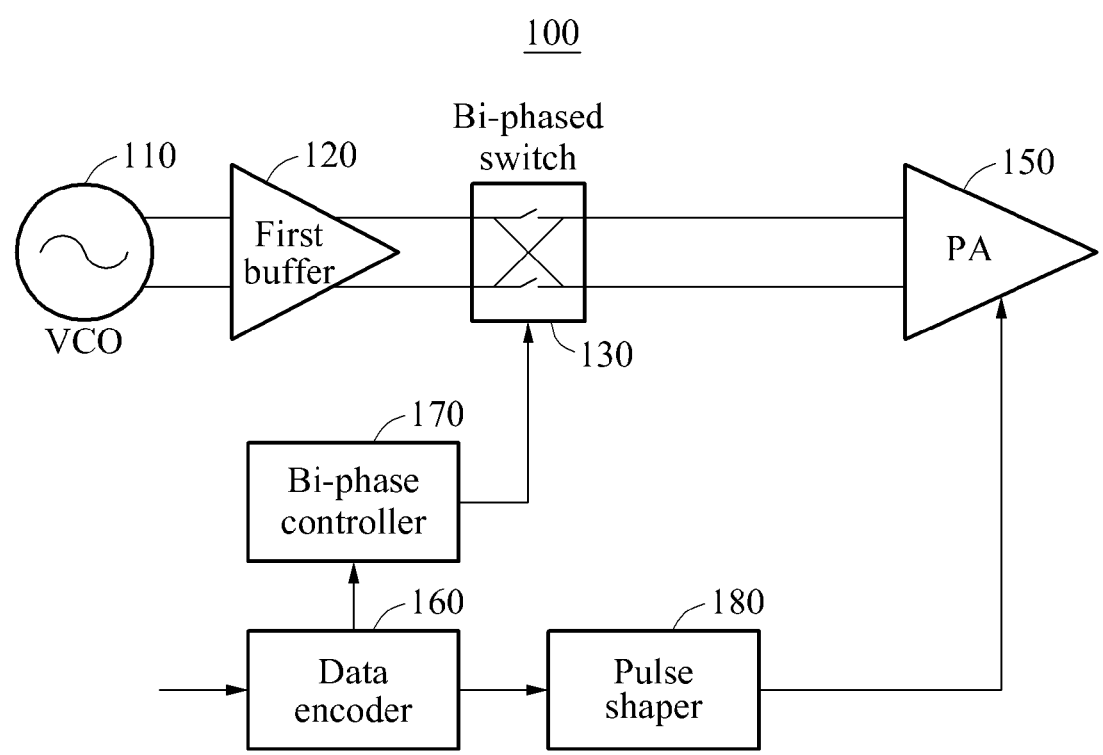

Referring to FIG. 1B, the OOK transmitter 100 may include a VCO 110, a first buffer 120, a bi-phased switch 130, a PA 150, a data encoder 160, a bi-phase controller 170, and a pulse shaper 180. The first buffer 120 is located between the VCO 110 and the bi-phased switch 130, for example. The first buffer 120 buffers the carrier generated by the VCO 110 and transfers the carrier to the bi-phased switch 130. The "buffering of the carrier" refers to a preventing, or implemented minimizing, of a frequency of the VCO 110 from being vibrated based on the output or a control of the bi-phase controller 170.

In FIG. 1B, by adding the first buffer 120 between the VCO 110 and the bi-phased switch 130, it is possible to minimize a degradation in phase noise occurring in the VCO 110 due to a bi-phasing operation of the bi-phased switch 130.

The first buffer 120 may minimize an impedance change shown in an output of the VCO 110 by the bi-phased switch 130 and the PA 150, and thereby may minimize the degradation in the phase noise occurring in the VCO 110 due to the bi-phasing operation.

Figure 1C:
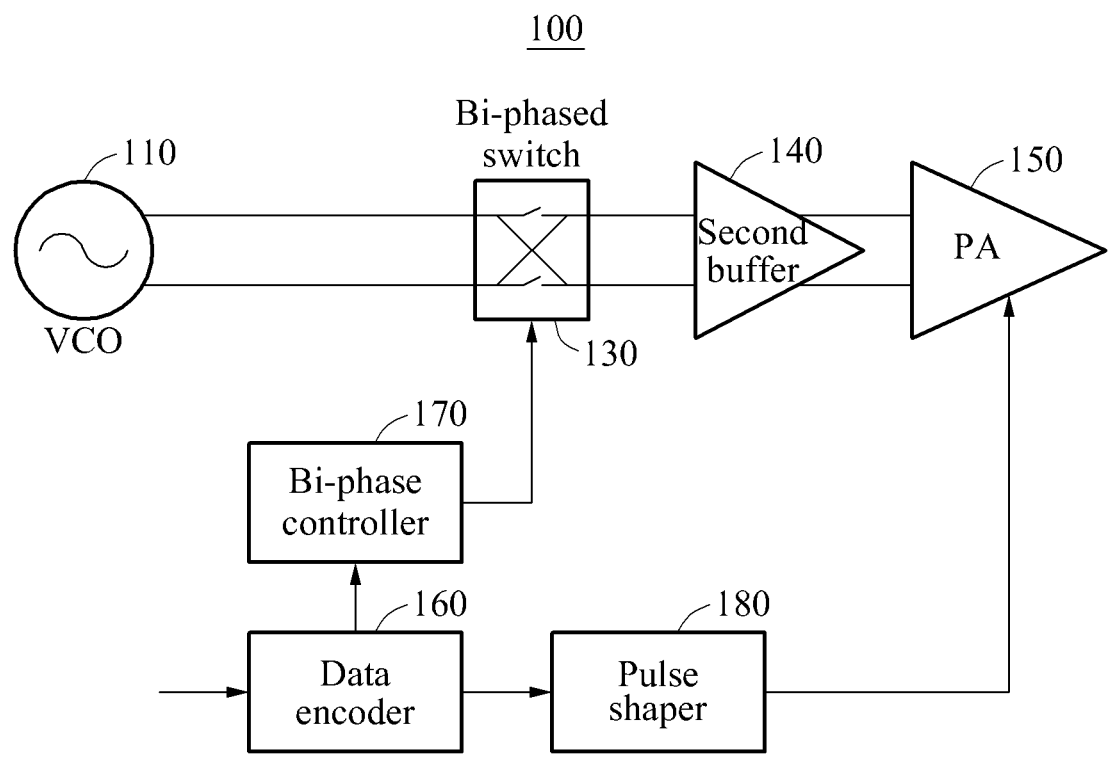

Referring to FIG. 1C, the OOK transmitter 100 may include a VCO 110, a bi-phased switch 130, a second buffer 140, a PA 150, a data encoder 160, a bi-phase controller 170, and a pulse shaper 180, for example.

The second buffer 140 is located between the bi-phased switch 130 and the PA 150. The second buffer 140 buffers the carrier with a phase changed by the bi-phased switch 130, and transfers the carrier to the PA 150. By adding the second buffer 340 in front of the PA 150, it is possible to minimize an influence of phase noise occurring in the carrier of the VCO 110 due to a pulse shaping operation of the pulse shaper 180.

The second buffer 140 may minimize the influence of the phase noise occurring in the carrier of the VCO 110 due to vibration of a load impedance of the VCO 110 due to a pulse shaping operation of the PA 150.

Figure 1D:
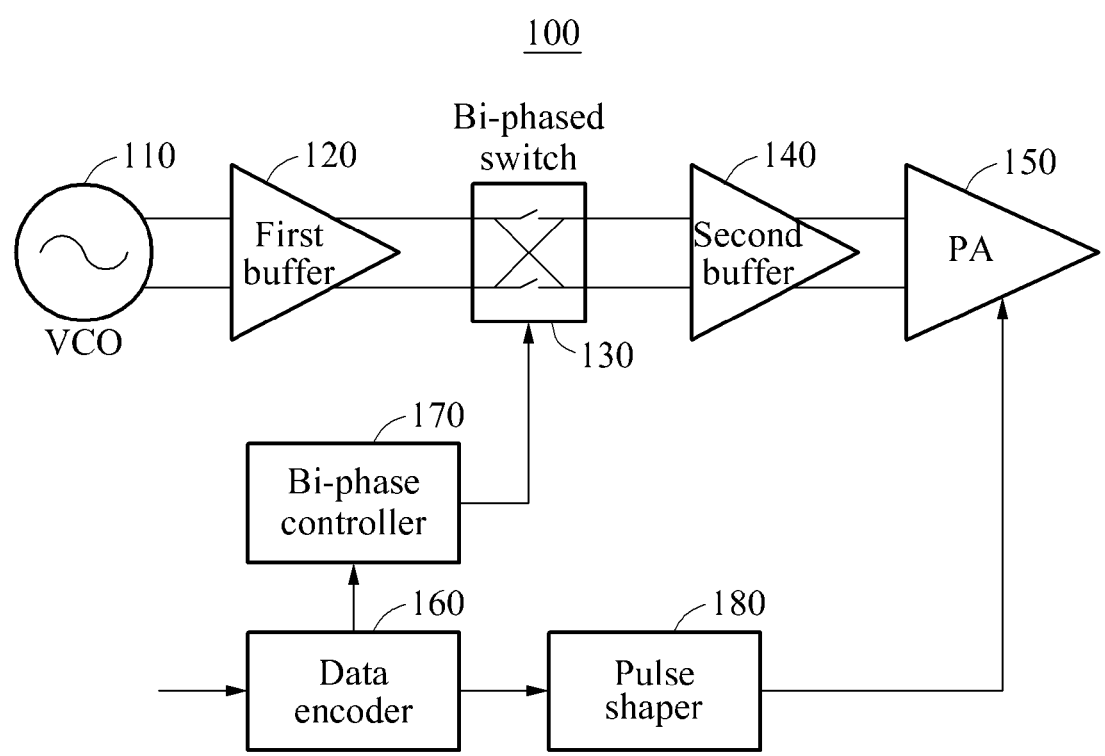

Referring to FIG. 1D, the OOK transmitter 100 may include a VCO 110, a first buffer 120 (such as in FIG. 1B), a bi-phased switch 130, a second buffer 140 (such as in FIG. 1C), a PA 150, a data encoder 160, a bi-phase controller 170, and a pulse shaper 180, for example.

Accordingly, FIGS. 1B and 1C respectively demonstrate the above described first buffer 120 and second buffer 140 being used individually, while FIG. 1D demonstrates that the first buffer 120 and the second buffer 140 may be used together, depending on embodiment, such as for desired power saving or other reasons.

In an example, a phase of a carrier may be randomly changed by performing synchronization at a chip rate, and accordingly it is possible to remove a harmonic spur occurring at a chip rate or ½ of the chip rate in an output waveform of the OOK transmitter 100. The chip rate is understood as a transmission rate, such as for the digital sequence corresponding to an output of the data encoder 160.

Figure 2A:
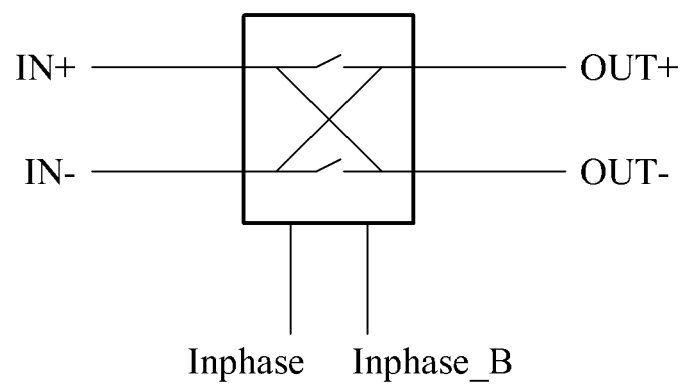
FIGS. 2A and 2B are diagrams illustrating a bi-phased switch, according to one or more embodiments.
Figure 2B:
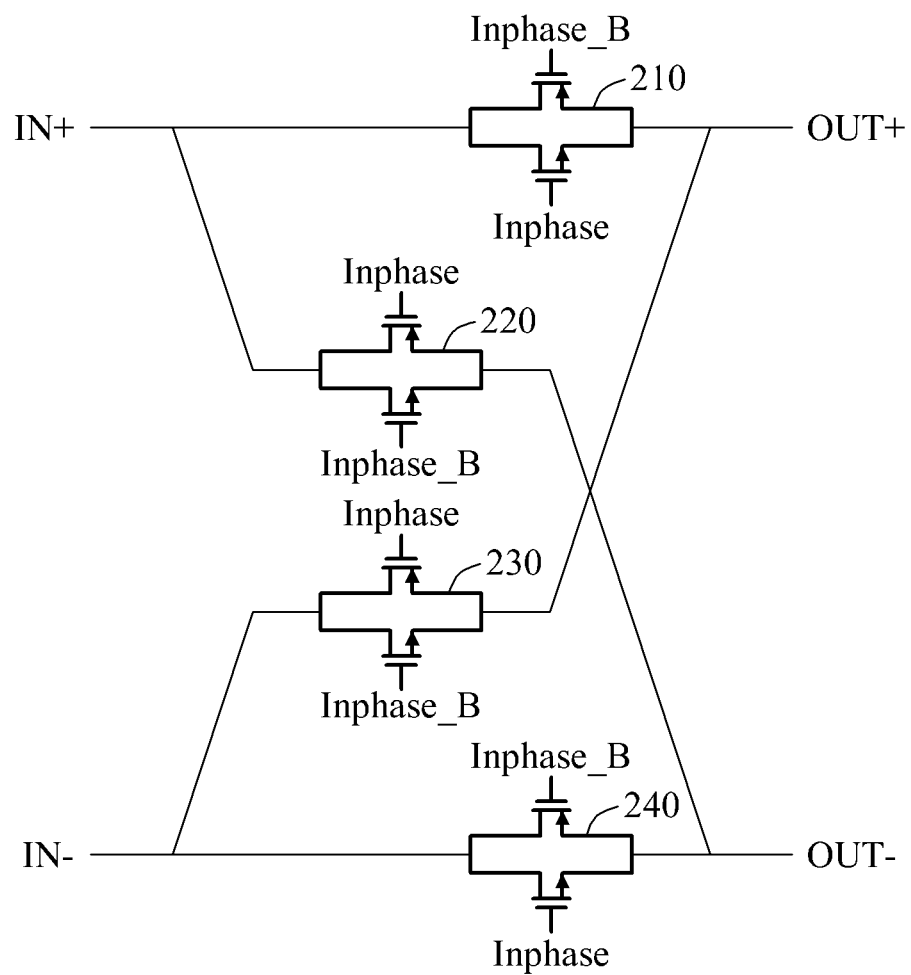

FIGS. 2A and 2B are diagrams illustrating a bi-phased switch, according to one or more embodiments. As only examples, FIG. 2A illustrates an illustration symbol for the bi-phased switch and FIG. 2B illustrates an example circuit represented by the illustration symbol for the bi-phased switch of FIG. 2A.

As only an example, the circuit of the bi-phased switch may include four transmission gates in total, for example, transmission gates 210, 220, 230 and 240 of FIG. 2B. Among the four transmission gates, two transmission gates, for example, the transmission gates 210 and 240 may be used as signal paths for a phase setting of 0-degrees, i.e., a 0-degree phase change, corresponding to an in-phase state, and the other transmission gates, for example, transmission gates 220 and 230 may be used as signal paths for a phase setting of 180-degrees, i.e., an 180-degree phase change, corresponding to an out-of-phase state. In this example, in each of the transmission gates 220 and 230, an illustrated positive (+) terminal and a negative (−) terminal cross each other to selectively implement the phase change.

FIG. 3 is a timing diagram illustrating an operation of an OOK transmitter, according to one or more embodiments.

FIG. 3 illustrates the data 310 that is input, the transmission sequence 320, the pulse 330, a control signal 340, an input 350 of a bi-phased switch, the output 360 of the bi-phased switch, and the transmission signal 370 of the OOK transmitter, such as the OOK transmitter of any of FIGS. 1A-1D. For example, the transmission sequence 320 may represent data encoded by the corresponding data encoder, the pulse 330 may represent a pulse shaping code generated by a corresponding pulse shaper, the control signal 340 may represent a control signal generated by a corresponding bi-phase controller, the input 350 may correspond to a carrier generated by a corresponding VCO, and the transmission signal 370 may correspond to an output of a corresponding PA.

In this example, a single bit of the data 310 is encoded to the transmission sequence 320 including four elements that have a value of "0" or "1." For example, the "0" and "1" in the data 310 are encoded to "0110" and "1001" encoding symbols in the transmission sequence 320, respectively. Here, each example "0110" or "1001" of the transmission sequence may respectively represent different periods of the transmission sequence. The above encoding is an example of encoding of OOK4 with a spreading factor of "4" performed by the data encoder, however, there is no limitation thereto, and embodiments are not limited to the same. Accordingly, other encoding schemes may be used.

The pulse 330 is a pulse that is generated by the pulse shaper based on the transmission sequence 320 to enhance a spectrum efficiency and that corresponds to the data 310. The pulse 330 has a shape of a quantized pulse.

The control signal 340 is controlled, e.g., by the bi-phase controller, to randomly change between the two phase states, for example, the illustrated "+1" and "−1" in a same period of time as a period of the transmission sequence 320. Here, the illustrated "+1" refers to a 0-degree phase change corresponding to an in-phase state, and the illustrated "−1" refers to a 180-degree phase change corresponding to an out-of-phase state. As illustrated in FIG. 3, the timing of transitions between elements in the transmission sequence 320 may be synchronized with the control signal 340, e.g., to synchronize when the changes in the control signal 340 are randomly implemented to change the phase of the input 350 with a transition between elements in the transmission sequence 320.

The input 350 corresponding to the carrier generated by the VCO, for example, in FIGS. 1A-1D may be caused to become bi-phased to have two phases, for example, 0 degrees and 180 degrees through the bi-phased switch, as represented by the output 360 corresponding to either 0 degrees or 180 degrees randomly being selected as a phase of the carrier based on the control signal 340 generated by the bi-phase controller.

The output 360 is combined with the pulse 330 in the PA and is output as the transmission signal 370. Thus, the carrier corresponding to the input 350 may be modulated as a Gaussian pulse-shaped code based on the control signal 340, similarly to the transmission signal 370. In an embodiment, a Gaussian pulse shape may be assumed, however, pulse shapes other than the Gaussian pulse shape may be used as a pulse code, similarly to an encoding scheme. In FIG. 3, changes in phases are indicated by dashed lines, and a dashed line oval 301 and a dashed line arrow 303 indicate phase changes from 0 degrees to 180 degrees.

Figure 4:
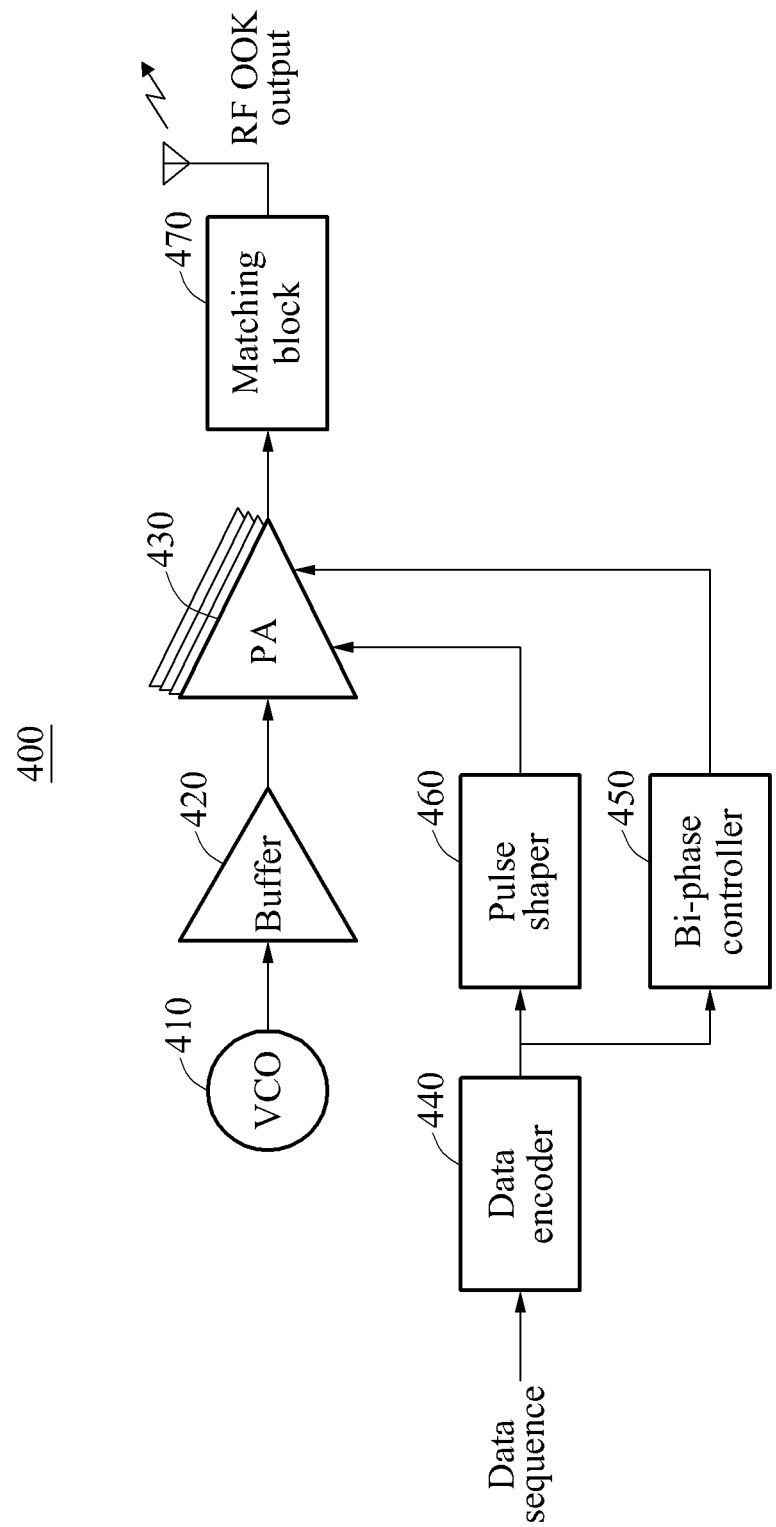
FIG. 4 is a block diagram illustrating an OOK transmitter, according to one or more embodiments.

FIG. 4 is a block diagram illustrating an OOK transmitter 400, according to one or more embodiments.

Referring to FIG. 4, the OOK transmitter 400 may include a VCO 410, a buffer 420, a PA 430, a data encoder 440, a bi-phase controller 450, a pulse shaper 460, and a matching block 470, for example.

The VCO 410 generates a carrier. In other words, the VCO 410 may output an RF oscillation signal corresponding to a carrier frequency.

The buffer 420 buffers the carrier generated by the VCO 410.

The PA 430 generates a transmission signal based on a control signal generated by the bi-phase controller 450 and a pulse generated by the pulse shaper 460.

The carrier generated by the VCO 410 is transferred to the PA 430 through the buffer 420, the output of which is then transmitted to an OOK receiver via an antenna. The PA 430 may be controlled to be powered on or off, to perform an OOK modulation of the carrier. The PA 430 includes, for example, a plurality of (for example, N) digital PAs with a thermometer code or a binary code, to shape a pulse. For example, when the carrier is selectively output using the plurality of digital PAs, an amplitude of the PA 430 may have N states. In an example of a binary code, the amplitude of the PA 430 may have 2N states.

The data encoder 440 encodes an input data sequence to a transmission sequence using a predetermined conversion scheme. For example, the data encoder 440 may encode a data sequence provided in a digital baseband in a preset sequence pattern with digital values. In an example, a pulse shaping code value obtained through M-fold oversampling of the transmission sequence output from the data encoder 440 is converted to N thermometer codes, and N digital PAs are individually controlled to be powered on or off. The N digital PAs are, for example, PAs including N binary codes.

The bi-phase controller 450 generates the control signal to randomly change a phase of the carrier by one of two phases, for example 0 degrees and 180 degrees, based on the transmission sequence. The generated control signal may be used to randomly change the phase of the carrier in a unit of time of each element in the transmission sequence output from the data encoder 440, to suppress a harmonic line spur occurring in the OOK transmitter 400.

The pulse shaper 460 generates a pulse corresponding to the input data based on the transmission sequence output from the data encoder 440. The transmission sequence output from the data encoder 440 may be oversampled by a digital filter included in the pulse shaper 460 and converted to a pulse shaping code.

The matching block 470 may perform impedance matching so that an output power of the PA 430 is transferred to the antenna with a minimum loss.

In accordance with an embodiment, a phase of a carrier in an RF region may be randomly changed by 0 degrees or 180 degrees during every, for example, period of a transmission sequence (for example, for each encoding symbol of the transmission sequence), and thus it is possible to remove a line spectrum phenomenon, that is, a periodicity of a power spectrum of a baseband symbol.

Figure 5:
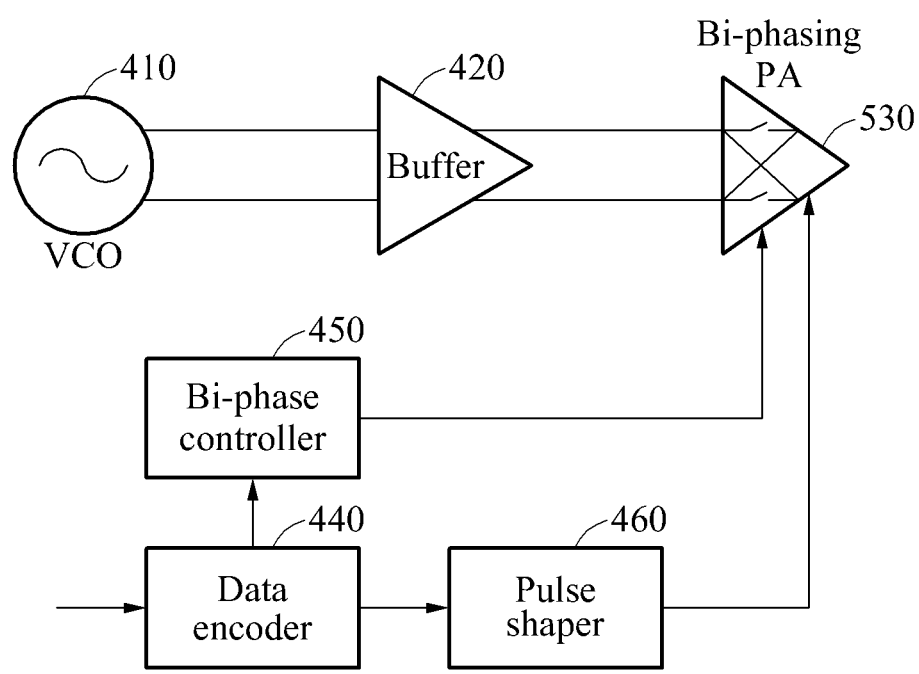
FIG. 5 is a block diagram illustrating an OOK transmitter including a bi-phasing power amplifier (PA), according to one or more embodiments.

FIG. 5 illustrates an OOK transmitter 500 including a bi-phasing PA 530, according to one or more embodiments.

Referring to FIG. 5, the OOK transmitter 500 may include a VCO 410, a buffer 420, the bi-phasing PA 530, a data encoder 440, a bi-phase controller 450, and a pulse shaper 460, for example.

The bi-phasing PA 530 randomly changes a phase of an input carrier generated by the VCO 410 based on a control signal, and generates a transmission signal corresponding to an input pulse. The bi-phasing PA 530 randomly changes the phase of the carrier in a unit of time of each element in a transmission sequence obtained through encoding, based on the control signal, and generates the transmission signal.

To suppress a line spectrum, the bi-phasing PA 530 randomly changes the phase of the carrier by 0 degrees or 180 degrees in the unit of time of each element in the transmission sequence, and generates the transmission signal.

The bi-phasing PA 530 is controlled to be powered on or off, to perform an OOK modulation of the carrier, and generates the transmission signal. As only an example, a more detailed description of such a bi-phasing PA 530 is shown in FIGS. 6A and 6B, or 9A and 9B.

In addition, the description above regarding FIG. 4 is equally applicable to components other than the bi-phasing PA 530 in the OOK transmitter 500, and accordingly such descriptions are not repeated here.

Figure 6A:
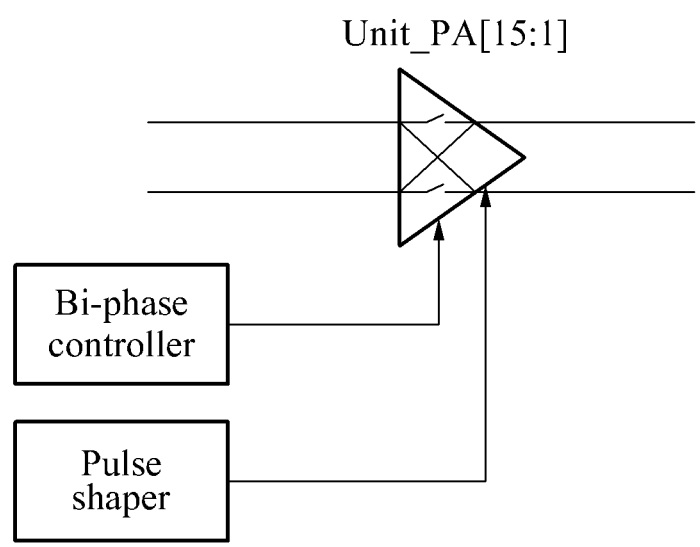
FIGS. 6A and 6B are diagrams illustrating a bi-phasing PA, according to one or more embodiments.
Figure 6B:
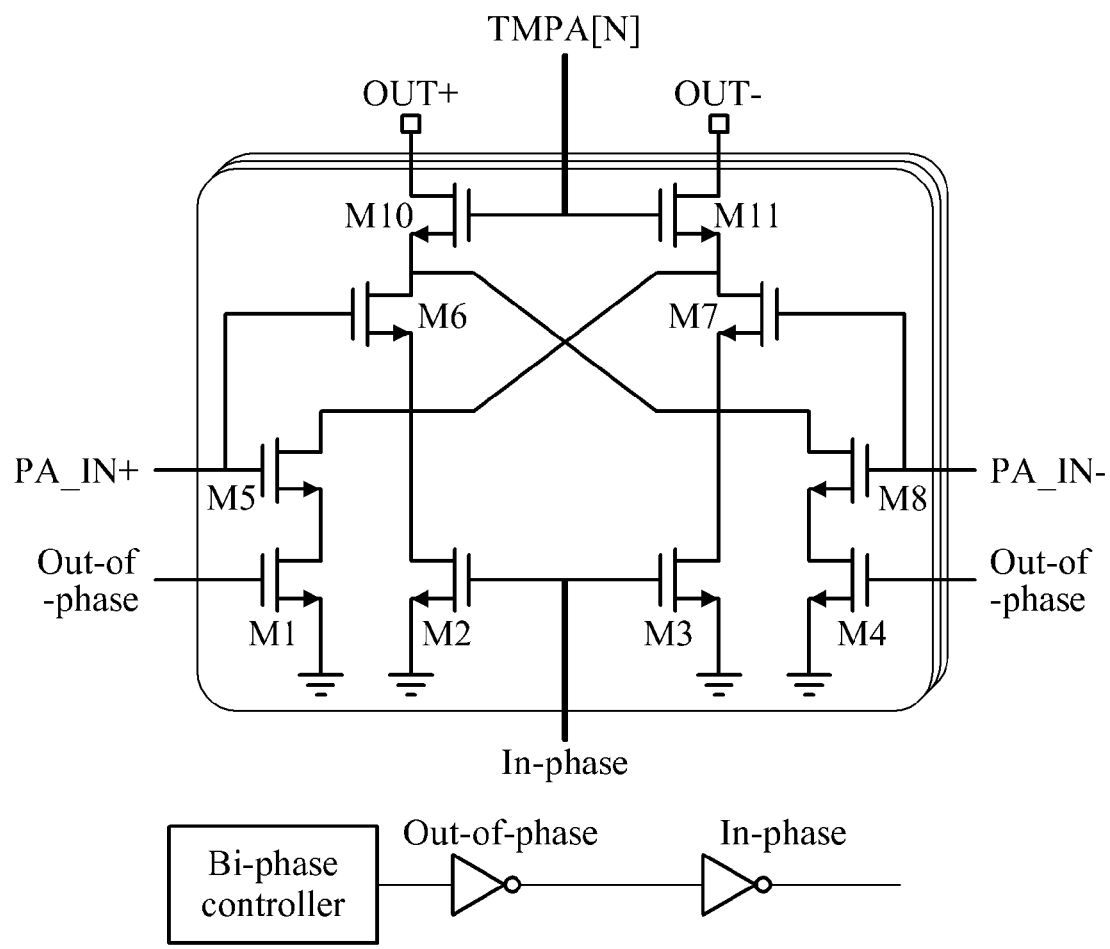

FIGS. 6A and 6B are diagrams illustrating a bi-phasing PA, according to one or more embodiments. As only examples, FIG. 6A illustrates an illustration symbol for a bi-phasing PA and FIG. 6B illustrates an example circuit represented by the illustration symbol of the bi-phasing PA of FIG. 6A.

The bi-phasing PA is a PA that is configured to implement a shifting of a phase of an output carrier by 0 degrees and 180 degrees, for example, based on a control signal (for example, a control signal from a bi-phase controller) applied by an external component or apparatus in a communication device or system embodiment.

Referring to FIG. 6B, a control signal is generated by the bi-phase controller and applied to the bi-phasing PA (for example, the illustrated power amplifier Unit_PA[15:1] of FIG. 6A) at an encoding data rate of 1 megahertz (MHz). The control signal is applied to a gate terminal of each of switching transistors M1, M2, M3 and M4 connected to a common source type of the bi-phasing PA. The control signal may be, for example, a phase shifting (PS) signal that is a switch control signal of "1" and "0." The PS signal may be in an in-phase state or an out-of-phase state based on the control signal.

Figure 7A:
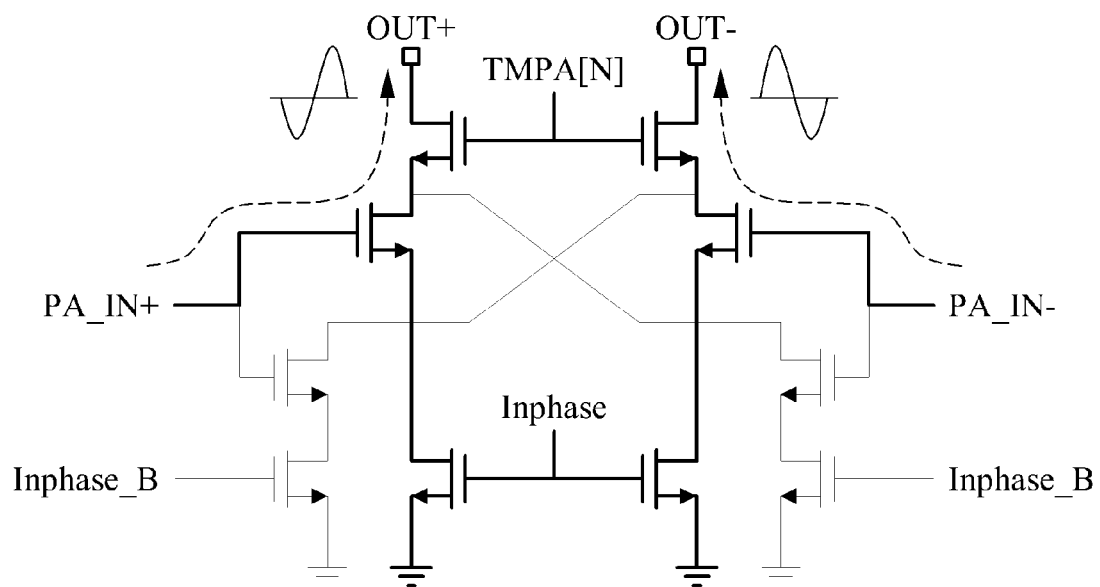
FIGS. 7A and 7B are diagrams illustrating example active signal paths of the bi-phasing PA of FIGS. 6A and 6B, according to one or more embodiments.
Figure 7B:
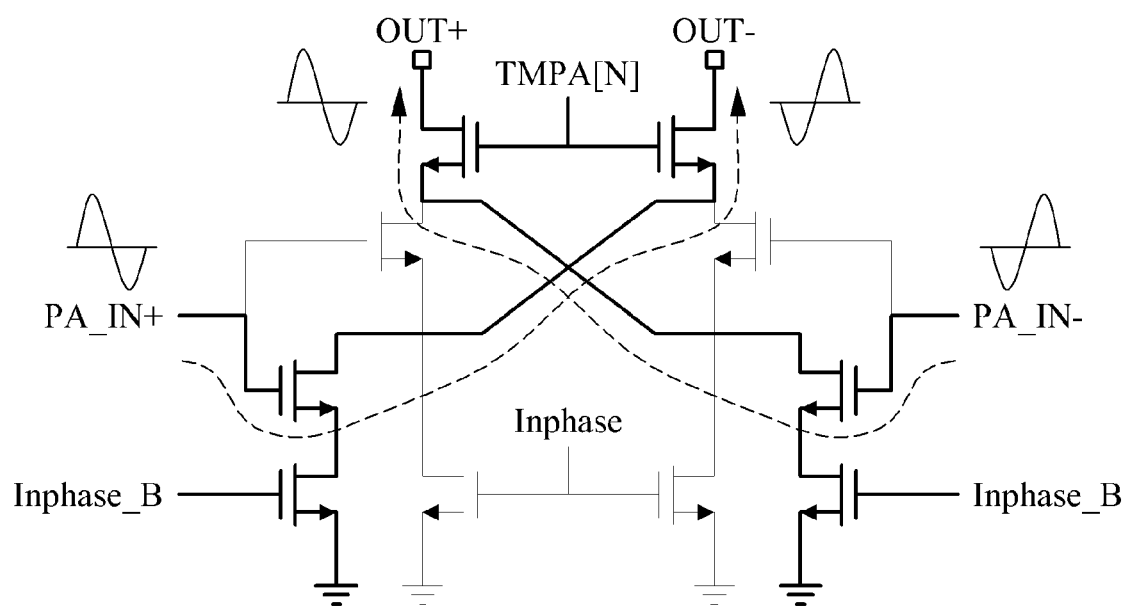

In an example, when the control signal is "1," the switching transistors M1[15:1] and M4[15:1] are turned on as a gain path of a signal. In another example, when the control signal is "0," the switching transistors M5 and M8 are turned on as a gain path of a signal. An active signal path of a bi-phasing PA that may similarly operate based on such a control signal is illustrated in FIGS. 7A and 7B. Here, the switching transistors of the bi-phasing PA may be considered a bi-phased switch of the bi-phasing PA.

A thermometer code TMPA[15:1] for Gaussian pulse shaping may be applied to a gate of each of transistors M10 and M11 of a cascode amplifier of the corresponding Unit_PA[15:1].

A TMPA signal may be applied to the bi-phasing PA at a sampling rate of 6 MHz corresponding to six times a transmission sequence obtained through encoding, for example, an encoding symbol. For a single Gaussian pulse, seven pieces of sampling data, for example, 1, 4, 9, 11, 9, 4 and 1, may be applied.

As also illustrated in FIG. 6B, the signal produced by the bi-phase controller may be used to generate the In-phase control signal (or Inphase) and an Out-of-phase (or Inphase_B) control signal.

FIGS. 7A and 7B are diagrams illustrating example active signal paths of the bi-phasing PA of FIGS. 6A and 6B, according to one or more embodiments.

FIG. 7A illustrates an active signal path in an example in which an in phase signal Inphase is "1," and FIG. 7B illustrates an active signal path in an example in which an in phase signal Inphase is "0." In an example, when the Inphase signal is "1," the Inphase_B signal may be "0" and a phase of an input signal may be the same as a phase of the output signal of the PA. In another example, when the Inphase signal is "0," the Inphase_B signal may be "1" and the phase of the input signal and the phase of the output signal may be reversed, or out of phase, by 180 degrees.

Figure 8A:
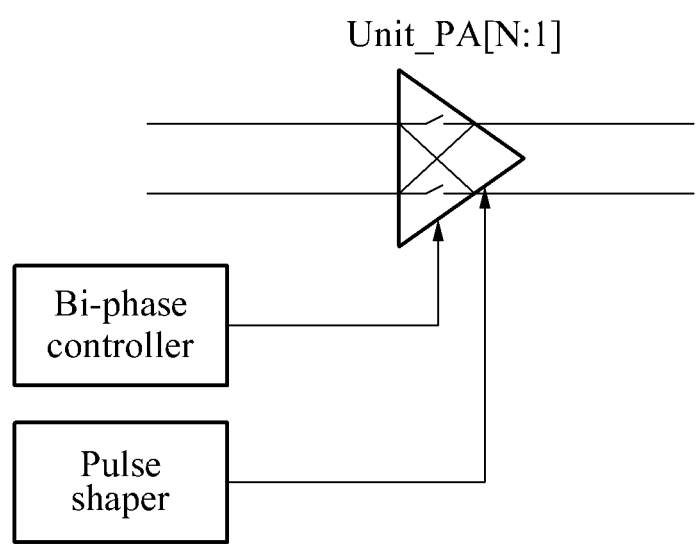
FIGS. 8A and 8B are diagrams illustrating a bi-phasing PA, according to one or more embodiments.
Figure 8B:
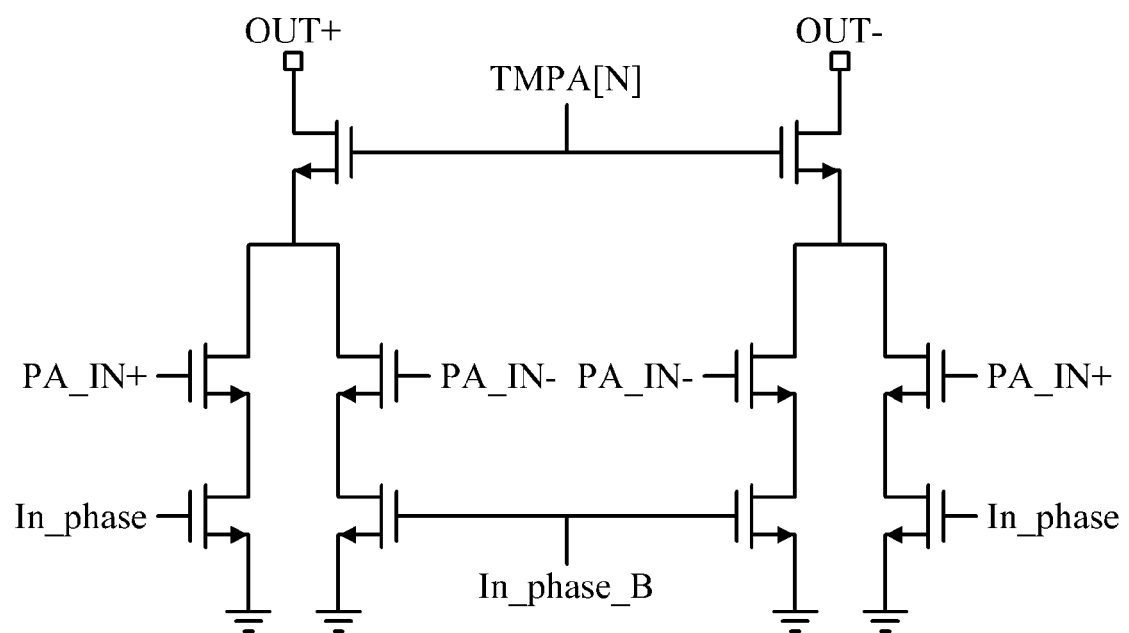

FIGS. 8A and 8B are diagrams illustrating a bi-phasing PA, according to one or more embodiments. As only examples, FIG. 8A illustrates an illustration symbol of the bi-phasing PA and FIG. 8B illustrates an example circuit represented by the illustration symbol of the bi-phasing PA of FIG. 8A. In FIGS. 8A and 8B, "Unit_PA [N:1]" is used to reference the bi-phasing PA.

Figure 9A:
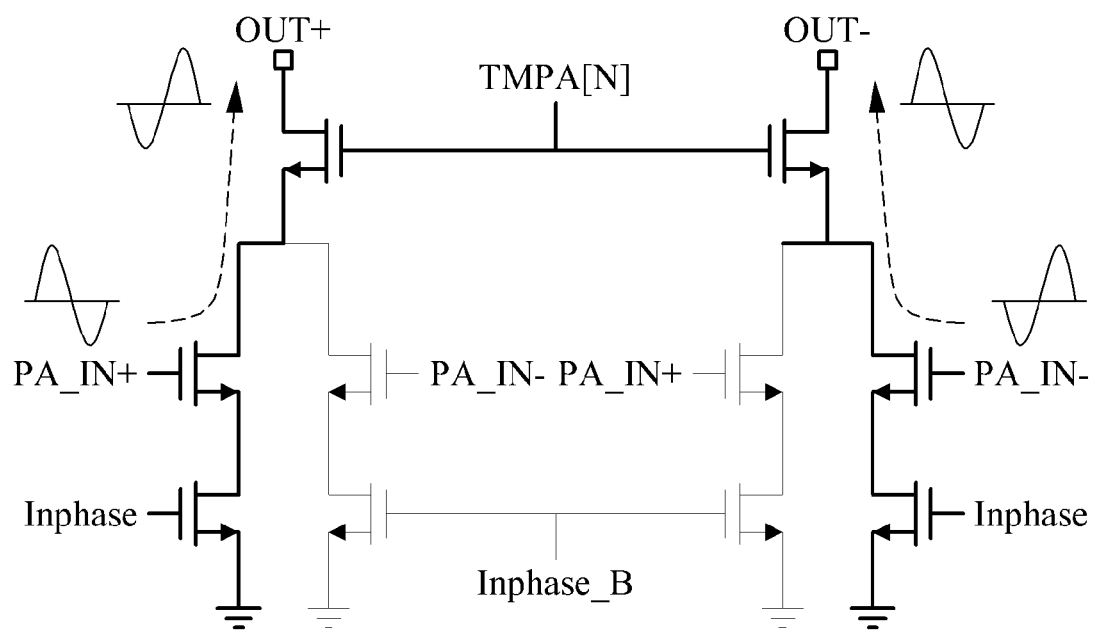
FIGS. 9A and 9B are diagrams illustrating example active signal paths of a bi-phasing PA, according to one or more embodiments.
Figure 9B:
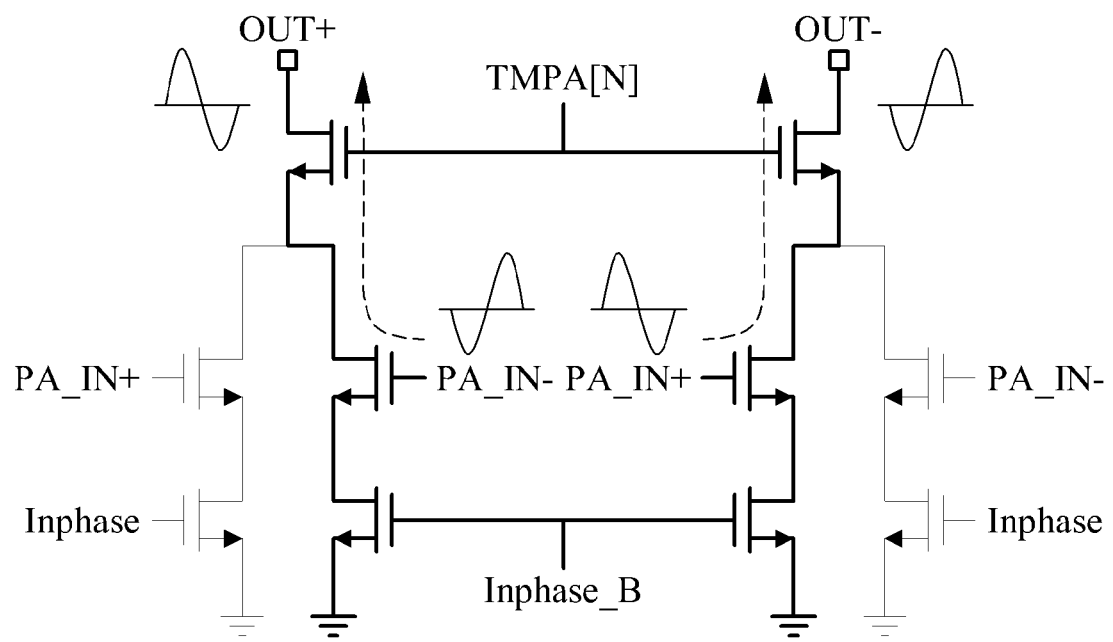

FIGS. 9A and 9B are diagrams illustrating example active signal paths of the bi-phasing PA of FIGS. 8A and 8B. Referring to FIG. 9A, when the Inphase signal is "1," the Inphase_B signal may be "0" and a phase of an input signal of the PA may be the same as a phase of an output signal of the PA. Referring to FIG. 9B, when the Inphase signal is "0," the Inphase_B signal may be "1" and the phase of the input signal and the phase of the output signal may be reversed by 180 degrees.

Figure 10:
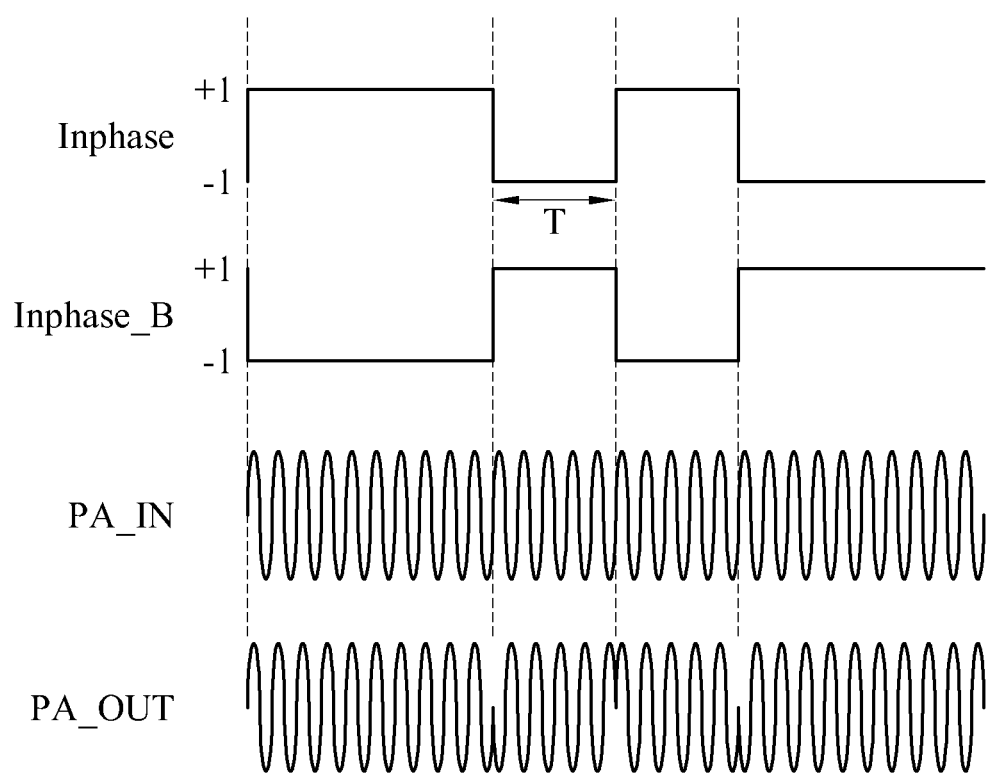
FIG. 10 is a diagram illustrating an example of a simulation result of a change in a phase of a bi-phasing PA, according to one or more embodiments.

FIG. 10 is a diagram illustrating an example of a simulation result of a change in a phase of a bi-phasing PA, according to one or more embodiments.

As shown in the simulation result of FIG. 10, the phase of the bi-phasing PA is changed by 180 degrees based on the control signal, implanted through Inphase and Inphase_B signals. When an Inphase signal changes from "1" to "0" or changes from "0" to "1," a phase of a carrier input PA_IN to the bi-phasing PA is reversed by 180 degrees and is output as PA_OUT.

Figure 11:
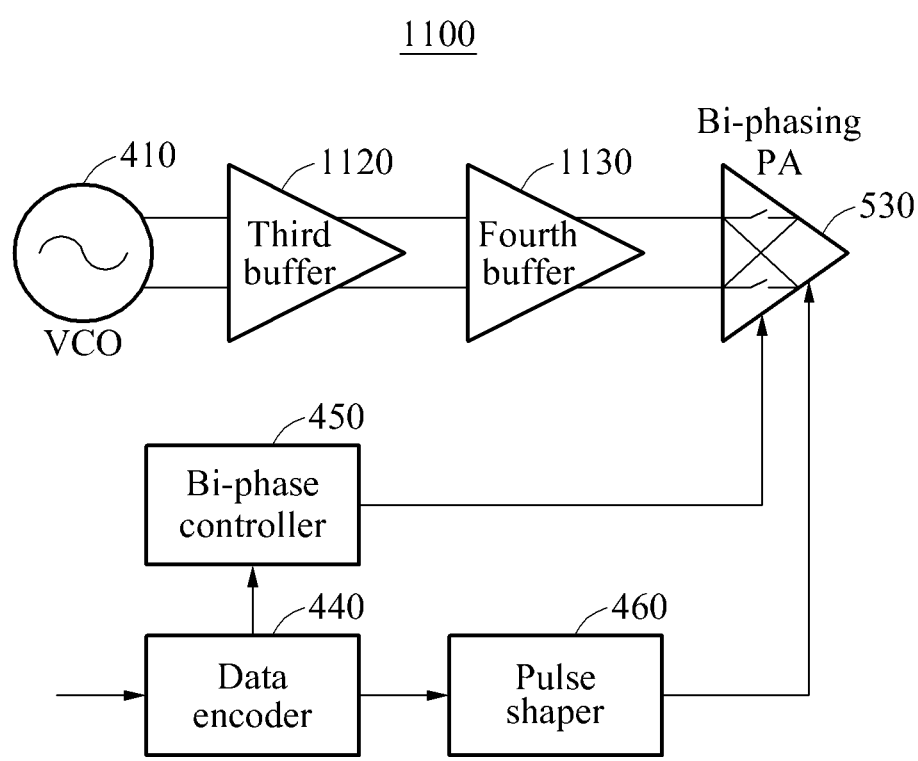
FIG. 11 is a block diagram illustrating an OOK transmitter including a bi-phasing PA, according to one or more embodiments.

FIG. 11 is a diagram illustrating an OOK transmitter 1100 including a bi-phasing PA, such as the bi-phasing PA 530 of FIG. 5, according to one or more embodiments.

Referring to FIG. 11, the OOK transmitter 1100 may include a VCO 410, a third buffer 1120, a fourth buffer 1130, the bi-phasing PA 530, a data encoder 440, a bi-phase controller 450, and a pulse shaper 460, for example. Here, though FIG. 11 will be described with reference to the bi-phase PA 530 of FIG. 5, this is only for convenience of description and embodiments are not limited to the same.

The third buffer 1120 buffers a carrier generated by the VCO 410 and transfers the buffered carrier to the fourth buffer 1130. The third buffer 1120 may operate similarly to the first buffer 120 of FIGS. 1B and 1D.

The fourth buffer 1130 buffers an output of the third buffer 1120 and transfers the output to the bi-phasing PA 530. In an embodiment, the fourth buffer 1130 may be used to minimize load pulling of the VCO 410 due to the bi-phasing PA 530.

The above description of FIGS. 4 and 5 are equally applicable to remaining illustrated components other than the third buffer 1120 and the fourth buffer 1130 in the OOK transmitter 1100, and accordingly descriptions of the same are not repeated here.

Thus, in accordance with one or more embodiments, for example, the OOK transmitter 1100 may be configured with the VCO 410, the third buffer 1120 and the bi-phasing PA 530 among the components of FIG. 11. In this example, the third buffer 1120 may buffer the carrier generated by the VCO 410, and the bi-phasing PA 530 may randomly change a phase of the carrier buffered by the third buffer 1120 based on a control signal and may generate a transmission signal corresponding to an input pulse. The pulse may be generated by the pulse shaper 460 based on a transmission sequence obtained by encoding input data by the data encoder 440. The bi-phasing PA 530 may randomly change the phase of the buffered carrier by 0 degree or 180 degrees in a unit of time of each element of the transmission sequence, and may generate the transmission signal.

Figure 12:
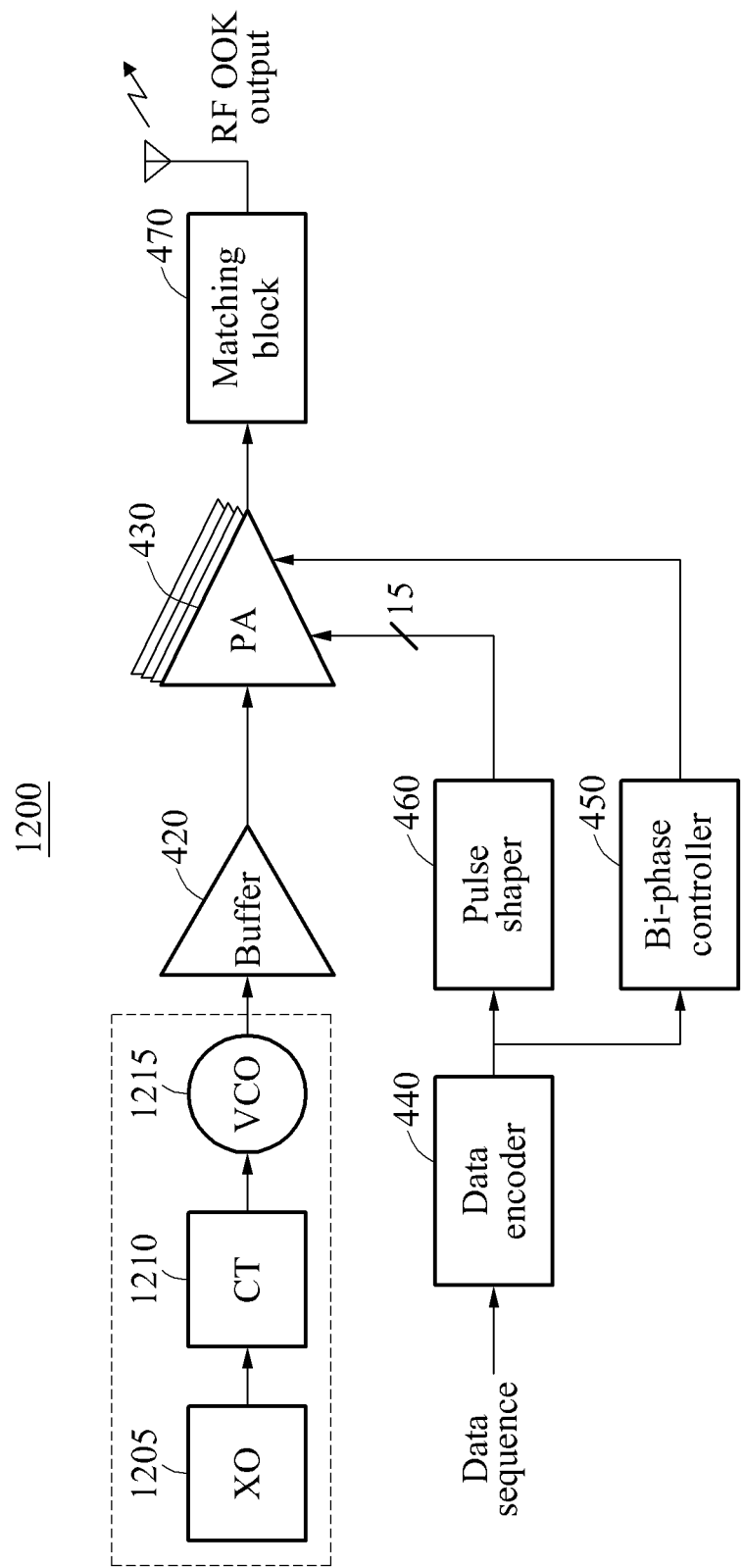
FIG. 12 is a block diagram illustrating an OOK transmitter including a frequency error correction circuit, according to one or more embodiments.

FIG. 12 is a block diagram illustrating an OOK transmitter 1200 including a frequency error correction circuit, according to one or more embodiments.

Referring to FIG. 12, the OOK transmitter 1200 may include a crystal oscillator (XO) 1205, a coarse tuner (CT) 1210, a VCO 1215, a buffer 420, a PA 430, a matching block 470, a data encoder 440, a bi-phase controller 450, and a pulse shaper 460, for example.

In one or more embodiments, the VCO 1215, the buffer 420, the PA 430, the matching block 470, the data encoder 440, the bi-phase controller 450, and the pulse shaper 460 may perform the same or similar operations as the VCO 410, the buffer 420, the PA 430, the matching block 470, the data encoder 440, the bi-phase controller 450, and the pulse shaper 460 of FIG. 4, respectively, and accordingly further description thereof is not repeated herein.

The XO 1205 may generate a reference frequency.

The CT 1210 may perform coarse tuning of an oscillation frequency of the VCO 1215. A coarse tuning scheme, e.g., of the CT 1210, will be described in greater detail below with reference to FIG. 13. The XO 1205, the CT 1210, and the VCO 1215 indicated by a dashed line box of FIG. 12 may form or represent such a coarse tuning circuit of FIG. 13.

In accordance with one or more embodiments, an OOK receiver, such as that discussed below with regard to FIG. 16, may be configured to detect an envelope during a demodulation of data because OOK modulation is used by the example power amplifier 430. Accordingly, with OOK modulation, exact phase information of a carrier is not needed, and a receiver can have a lower sensitivity to a frequency accuracy than that of the transmitter.

In accordance with one or more embodiments, such an OOK transmitter and OOK receiver may operate using a coarse tuning scheme based on an on/off cycle, instead of continuously using a phase locked loop (PLL), for example, with a relatively high amount of power to be consumed, based on the above characteristics. The PLL may be used to control a frequency of each of a transmission carrier and a reception carrier based on the on/off cycle.

Also, the coarse tuning scheme may be used to tune frequencies of multiple channels.

In an embodiment, the CT 1210 may track a frequency using a 15-bit capacitor bank (not shown), e.g., included in the VCO 1215, with a fine resolution. By using the 15-bit capacitor bank, it is possible to prevent a frequency drift from frequently occurring even though the CT 1210 may be deactivated after a target channel frequency is locked.

In an example, before a transmission of a transmission signal occurs, a frequency is tuned using the CT 1210. During the transmission of the transmission signal, a frequency synthesis may be performed based on a periodic duty cycle to power off the CT 1210. By performing the frequency synthesis based on the periodic duty cycle, power consumption due to the frequency synthesis in a PLL may be minimized.

Figure 13:
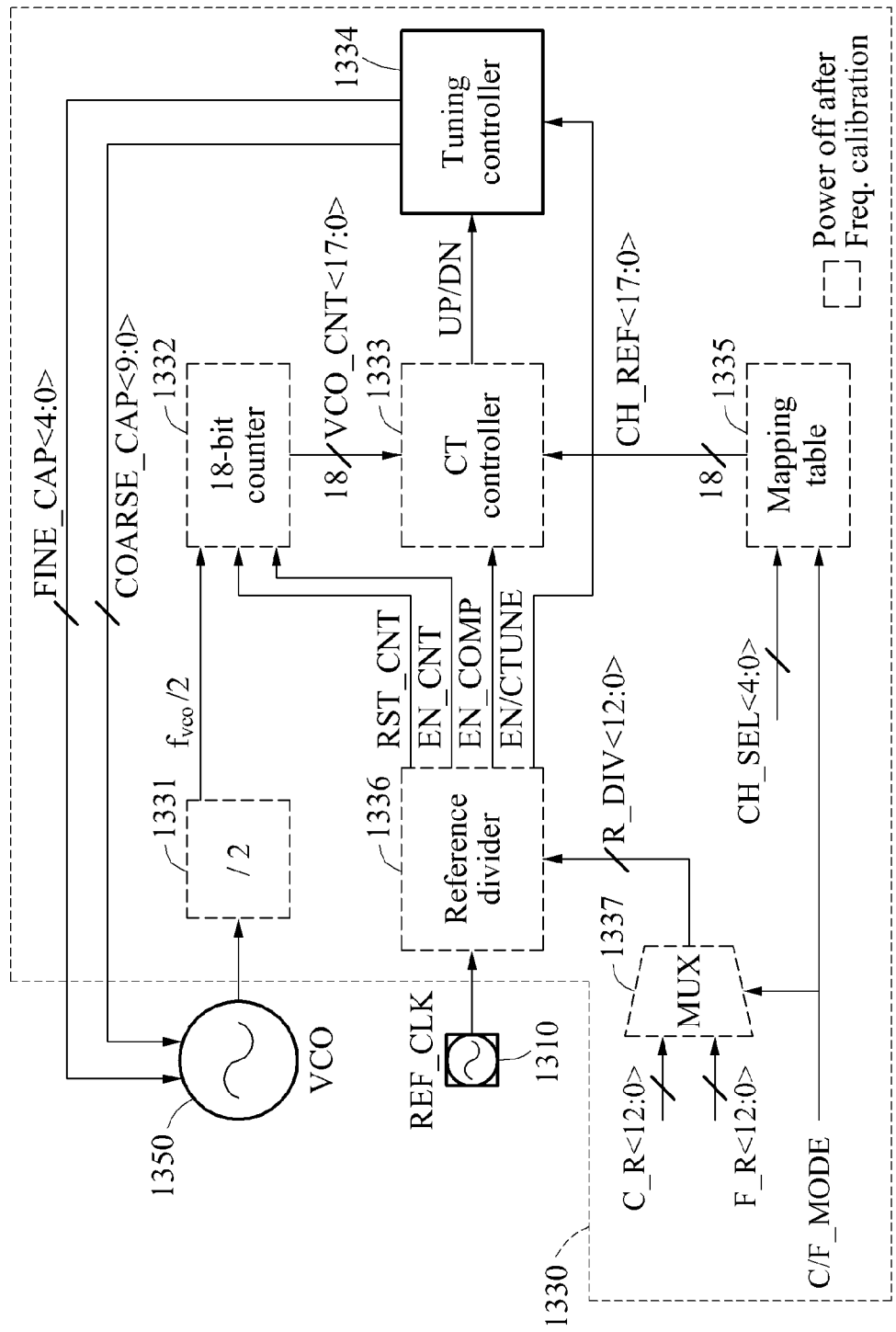
FIG. 13 is a diagram illustrating a coarse tuning circuit to correct a frequency error, according to one or more embodiments.

FIG. 13 is a diagram illustrating a coarse tuning circuit to correct a frequency error, according to one or more embodiments.

Referring to FIG. 13, a CT 1330 may operate based on a periodic duty cycle.

When the CT 1330 receives channel information CH_SEL<4:0>, a mapping table 1335 is used to convert the channel information to a corresponding reference channel code CH_REF<17:0>.

An oscillation frequency generated by a VCO 1350 may be divided by "2" by a divider 1331, which is then input to an 18-bit counter 1332. An output VCO_CNT<17:0> of the 18-bit counter 1332 is compared to the reference channel code CH_REF<17:0> in a coarse tuning (CT) controller 1333.

The CT controller 1333 transmits an up signal UP or a down signal DN to a tuning controller 1334 based on a comparison between the output VCO_CNT<17:0> and the reference channel code CH_REF<17:0> and a successive approximation register (SAR) logic.

Through the above frequency tracking loop, Coarse Cap<9:0> and Fine Cap<4:0> of the VCO 1350 may be tuned based on a target frequency and locked. A lock time and an accuracy of a tracking loop are traded off based on an activation time of the 18-bit counter 1332. The 18-bit counter 1332 is set by, for example, a signal EN_CNT with "1."

The coarse tuning scheme may include two operations, for example, coarse tracking with an activation time of 120×REF_CLK and fine tracking with an activation time of 1000×REF_CLK.

A multiplexer (MUX) 1337 may select a coarse tracking control signal C_R<12:0> and a fine tracking control signal F_R<12:0> based on a signal C/F_MODE, and transmit the selected coarse tracking control signal C_R<12:0> and the selected fine tracking control signal F_R<12:0> to a reference divider 1336.

In an embodiment, when frequency calibration is completed, almost all blocks in the CT 1330 except the tuning controller 1334 may be powered off. For example, the divider 1331, the 18-bit counter 1332, the CT controller 1333, the mapping table 1335, the reference divider 1336, and the MUX 1337, indicated by a dashed line box of FIG. 13, are powered off after frequency calibration is completed.

Figure 14:
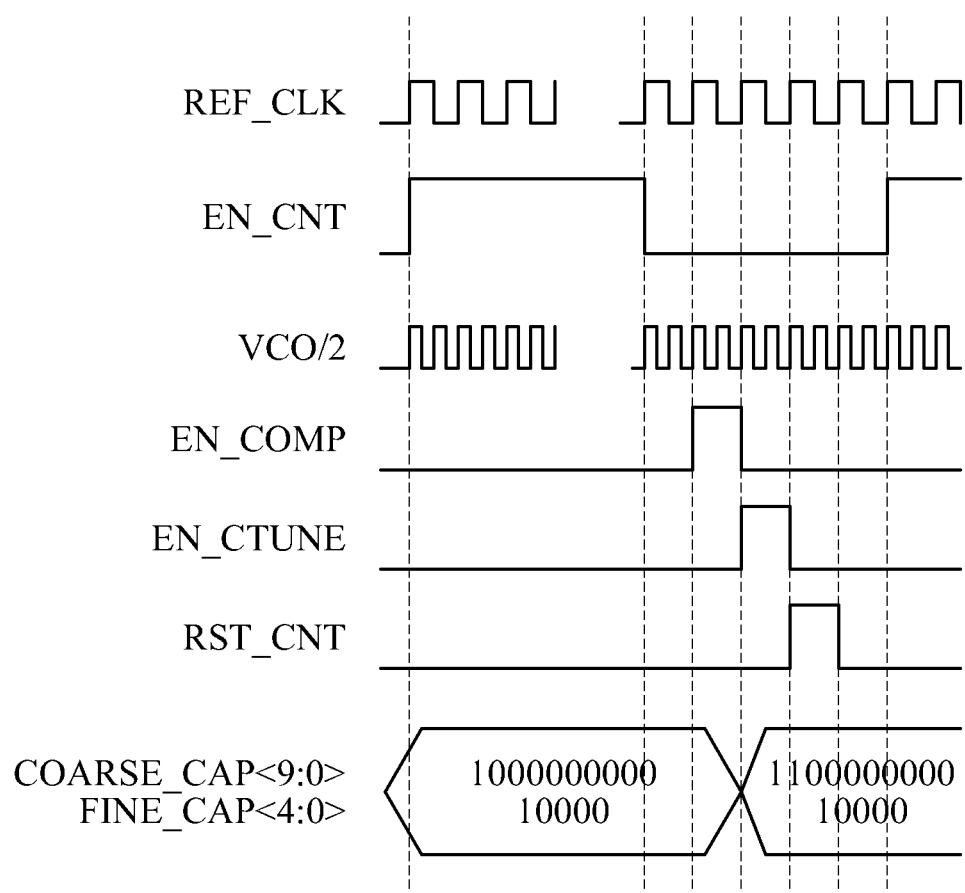
FIG. 14 is a timing diagram illustrating an example of an operation of a coarse tuning circuit, according to one or more embodiments.

FIG. 14 is a timing diagram illustrating an example of an operation of a coarse tuning circuit, such as the coarse tuning circuit of FIG. 13, according to one or more embodiments. When a signal EN_CNT applied to the 18-bit counter 1332 is high or "1," the 18-bit counter 1332 starts counting. When the signal EN_CNT is low or "0," a signal EN_COMP applied to the CT controller 1333, a signal EN_CTUNE applied to the tuning controller 1334, and a reset signal RST_CNT applied to the 18-bit counter 1332 are sequentially activated so that updating of a capacitor bank value and a comparing operation may be performed by the CT controller 1333 and that a reset operation may be performed by the 18-bit counter 1332. The signals RST_CNT, EN_CNT, EN_COMP, and EN_CTUNE are obtained by the reference divider 1336 dividing a reference clock generated by an XO.

Figure 15A:
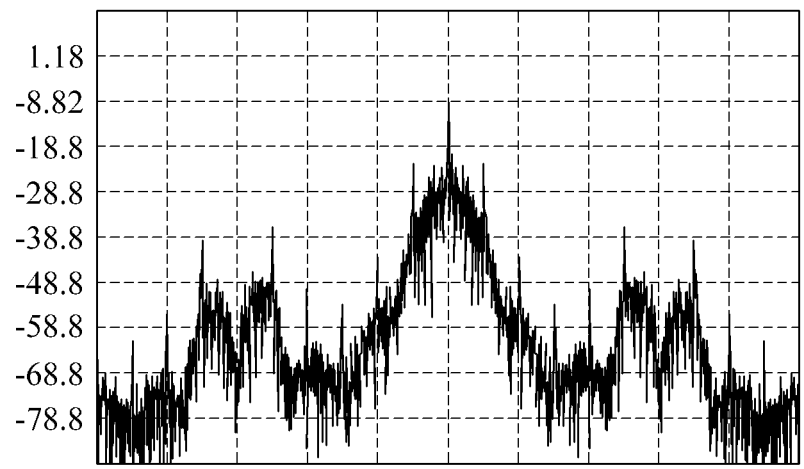
FIGS. 15A and 15B are graphs provided to compare spectra obtained before and after a phase of a carrier is changed in an OOK transmitter, according to one or more embodiments.
Figure 15B:
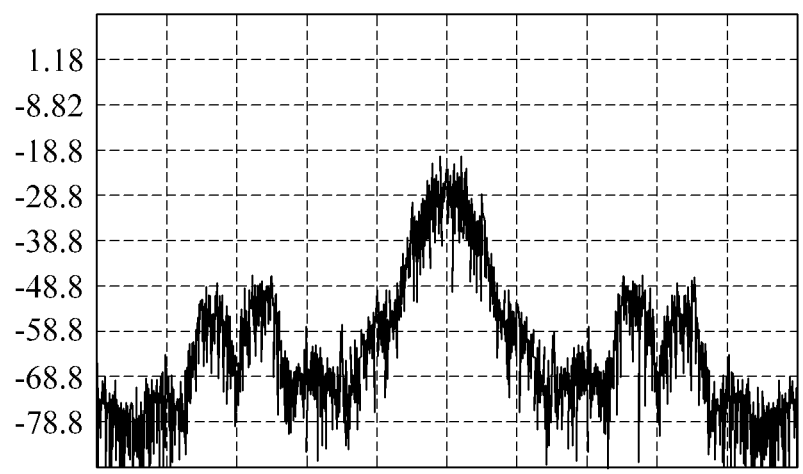

FIGS. 15A and 15B are graphs provided to compare spectra obtained before and after a phase of a carrier is changed in an OOK transmitter, according to one or more embodiments.

Referring to FIGS. 15A and 15B, when a phase of a carrier is randomly changed through bi-phase switching or bi-phasing power amplification at a rate of 1 Mchip/sec, for example, line spurs shown at intervals of 1 MHz disappear compared to a power amplification without phase changes.

In accordance with an embodiment, a bi-phased switch or bi-phasing PA performs bi-phasing of a carrier, and thus it is possible to remove a harmonic spur in a transmission spectrum and to prevent spectrum mask matching of an OOK transmitter and a reduction in a quality of a transmission signal.

Figure 16:
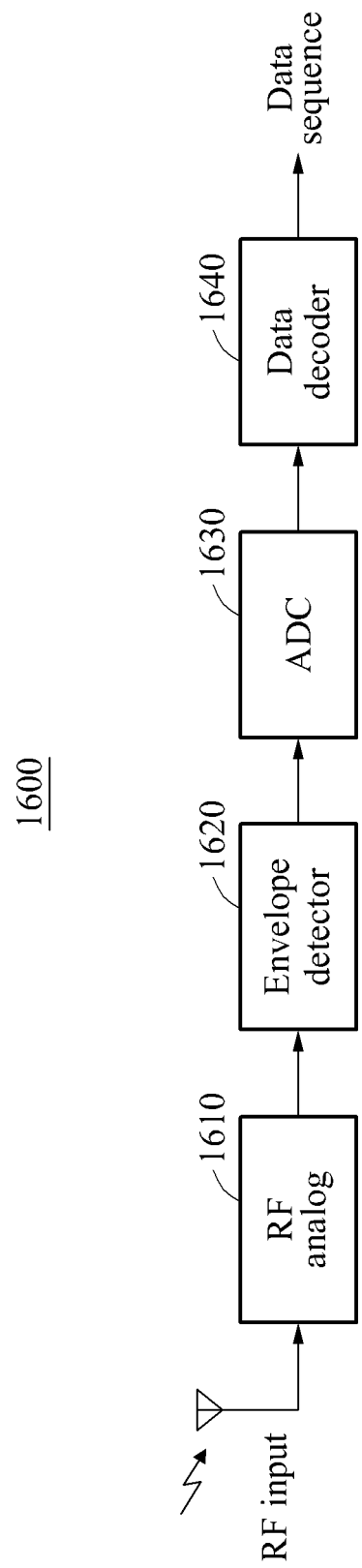
FIG. 16 is a block diagram illustrating an OOK receiver, according to one or more embodiments.

FIG. 16 is a block diagram illustrating of an OOK receiver 1600, according to one or more embodiments.

Referring to FIG. 16, the OOK receiver 1600 may include an RF/analog block 1610, an envelope detector 1620, an analog-to-digital converter (ADC) 1630, and a data decoder 1640, for example.

A signal received via an antenna is amplified by the RF/analog block 1610, and an amplified modulated carrier is demodulated to a baseband signal by the envelope detector 1620.

Because the envelope detector 1620 demodulates the signal using a square operation, bi-phasing inserted to remove line spurs does not have an influence on the demodulating. A signal digitized by the ADC 1630 (or a comparator), may be recovered as a data sequence by the data decoder 1640.

As described above, the OOK receiver 1600 demodulates the signal through envelope detection, and accordingly randomly changing of a phase of a carrier every period of a transmission sequence obtained through encoding may not have an influence on a demodulation process.

Figure 17:
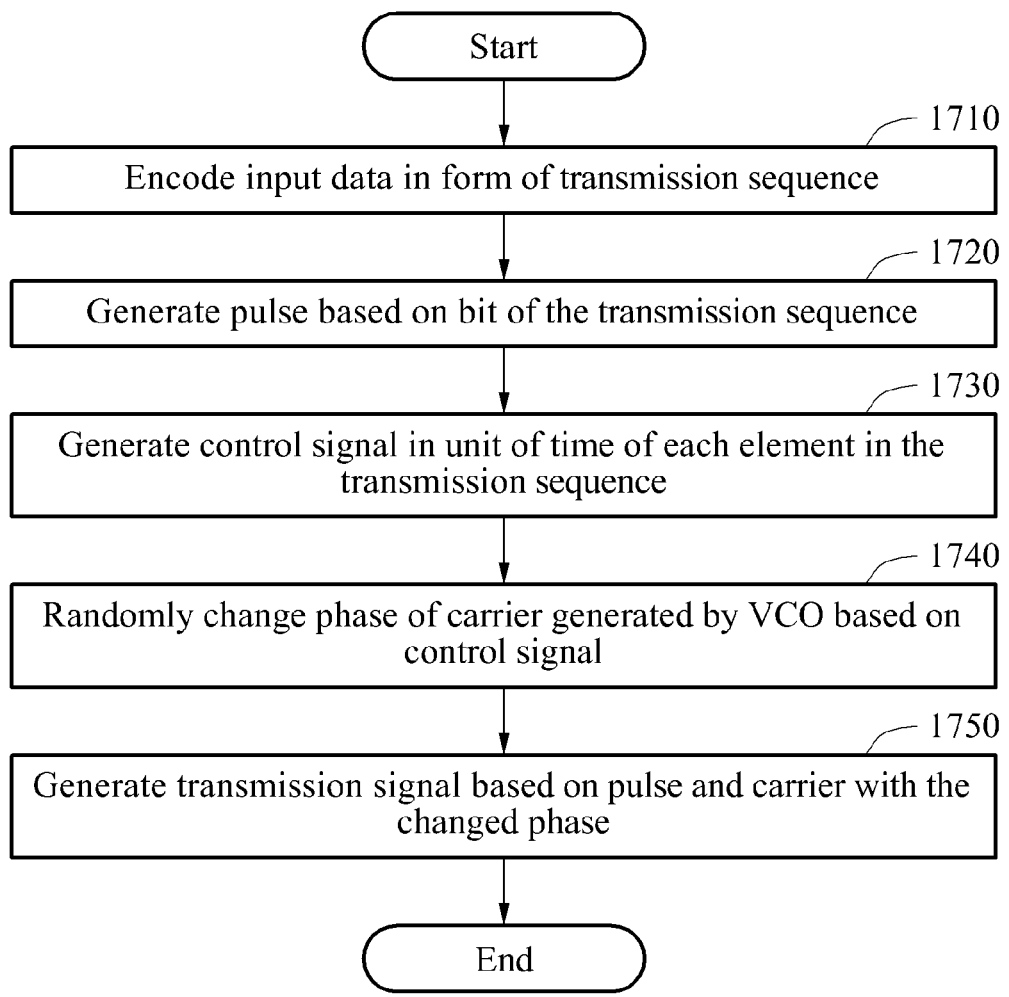
FIG. 17 is a flowchart illustrating a communication method, according to one or more embodiments.

FIG. 17 is a flowchart illustrating a communication method, according to one or more embodiments.

Referring to FIG. 17, in operation 1710, a transmitter encodes input data in the form of a transmission sequence.

In operation 1720, the transmitter generates a pulse corresponding to the input data based on the transmission sequence.

In operation 1730, the transmitter generates a control signal to randomly change a phase by one of two phases in a unit of time of each element in the transmission sequence.

In operation 1740, the transmitter randomly changes a phase of a carrier generated by a VCO, based on the control signal. The transmitter randomly changes the phase of the carrier by 0 degrees or 180 degrees in a unit of time of each element in the transmission sequence, based on the control signal.

In operation 1750, the transmitter generates a transmission signal based on the pulse generated in operation 1720 and the carrier with the phase changed in operation 1740.

In an example, the transmitter buffers the carrier generated by the VCO, and performs operation 1740. In another example, the transmitter buffers the carrier having the phase changed in operation 1740, and performs operation 1750.

Figure 18:
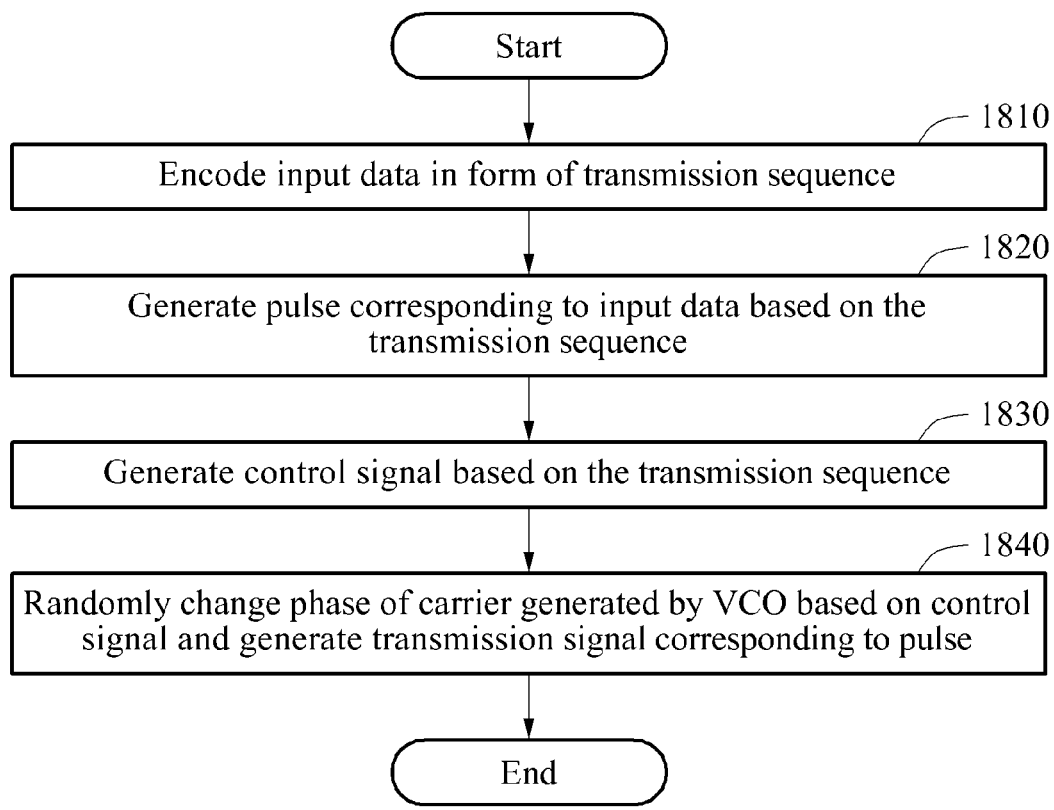
FIG. 18 is a flowchart illustrating a communication method, according to one or more embodiments.

FIG. 18 is a flowchart illustrating a communication method, according to one or more embodiments.

Referring to FIG. 18, in operation 1810, a transmitter encodes input data in the form of a transmission sequence.

In operation 1820, the transmitter generates a pulse corresponding to the input data based on the transmission sequence.

In operation 1830, the transmitter generates a control signal based on the transmission sequence. The control signal is used to randomly change a phase by one of two phases.

In operation 1840, the transmitter randomly changes a phase of a carrier generated by a VCO based on the control signal generated in operation 1830, and generates a transmission signal corresponding to the pulse. In operation 1840, the transmitter randomly changes the phase of the carrier by 0 degrees or 180 degrees in a unit of time of each element in the transmission sequence based on the control signal, and generates the transmission signal.

Below, though aspects of the methods of FIGS. 17 and 18 have been described with regard to a transmitter, embodiments are not limited to the same, and the described operations may be implemented by another communication device or system. With further regard to FIGS. 17 and 18, any of the above description of operations of FIGS. 1A through 15B are equally applicable to, and depending on embodiment similarly represented by, the communication methods of FIGS. 17 and 18. Accordingly, such above descriptions have not been repeated in the discussion of FIGS. 17 and 18. An embodiment of the present disclosure similarly includes a communication method represented by the receiver description of FIG. 16, so that such descriptions are similarly not repeated here.

In addition to the elements of FIGS. 1A-2, 4-9B, 11-13, and 16 being hardware elements or components, the methods of FIGS. 17 and 18 may be implemented by hardware components, including the above discussed example hardware elements and/or one or more processing devices, or processors, or computers, and the elements or components of FIGS. 1A-2, 4-9B, 11-13, and 16 may similarly be included in an electronic device embodiment as hardware components thereof. Hardware components may include, as only examples, resistors, transistors, capacitors, inductors, power supplies, controllers, frequency generators, operational amplifiers, power amplifiers, low-pass filters, high-pass filters, band-pass filters, analog-to-digital converters, digital-to-analog converters, and processing device(s), processor(s), and/or computer(s), as only examples. A processing device, processor, or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processing device, processor, or computer includes, or is connected to, one or more memories storing instructions or software that are executed by the processing device, processor, or computer and that may control the processing device, processor, or computer to implement one or more methods described herein. Hardware components implemented by a processing device, processor, or computer may execute instructions or software, such as an operating system (OS) and one or more software applications that run on the OS, to perform or control one or more of the operations described herein with respect to FIGS. 17 and 18, for example. The hardware components also access, manipulate, process, create, and/or store data in response to execution of the instructions or software. For simplicity, the singular term "processing device", "processor", or "computer" may be used in the description of the examples described herein, but in other examples multiple processing devices, processors, or computers are used, or a processing device, processor, or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing, as only examples.

The methods illustrated in FIGS. 17 and 18 that perform or control the operations described herein may be performed or controlled by a processing device, processor, or a computer as described above executing instructions or software to perform one or more of the operations described herein.

Instructions or software to control a processing device, processor, or computer to implement the hardware components and perform the methods as described above may be written as computer programs, code segments, instructions or any combination thereof, for individually or collectively instructing or configuring the processing device, processor, or computer to operate as a machine or special-purpose computer to perform the operations performed by the hardware components and the methods as described above. In one example, the instructions or software include machine code that is directly executed by the processing device, processor, or computer, such as machine code produced by a compiler. In another example, the instructions or software include higher-level code that is executed by the processing device, processor, or computer using an interpreter. Based on the disclosure herein, and after an understanding of the same, programmers of ordinary skill in the art may readily write the instructions or software based on the block diagrams and the flow charts illustrated in the drawings and the corresponding descriptions in the specification, which disclose such method operations and which may be performed or implemented by any of the above described hardware components, for example.

The instructions or software to control a processing device, processor, or computer to implement the hardware components, such as discussed in any of FIGS. 1A-2, 4-9B, 11-13, and 16 and perform or control the implementation of the methods as described above in FIGS. 17 and 18, and any associated data, data files, and data structures, are recorded, stored, or fixed in or on one or more non-transitory computer-readable storage media. Examples of a non-transitory computer-readable storage medium include read-only memory (ROM), random-access memory (RAM), dynamic random-access memory (D-RAM), static random-access memory (S-DRAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processing device, processor, or computer so that the processing device, processor, or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor, or computer.

As a non-exhaustive example only, and in addition to the above explanation of potential hardware implementations of the electronic device, an electronic device embodiment herein, such as an electronic device embodiment that includes any of the communication devices of FIGS. 1A-2, 4-9B, 11-13, and 16, as only an example, may also be a mobile device, such as a cellular phone, a smart phone, a wearable smart or bio-signal device, a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a television or display, a DVD player, a Blu-ray player, a set-top box, or a home appliance, an Internet of Things device, or any other mobile or stationary device, e.g., capable of wireless or network communication. As only an example, the communication device may be a device that transmits data according to a WBAN protocol.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:

1. An on-off keying (OOK) transmitter comprising:
   a buffer configured to buffer a carrier, generated by a voltage-controlled oscillator (VCO), to reduce effects of operations of a bi-phasing power amplifier (PA) on the VCO; and
   the bi-phasing PA configured to randomly change a phase of the buffered carrier based on a control signal and to generate a transmission signal corresponding to generated pulses, the pulses being generated based on a transmission sequence obtained by an encoding of data.

2. The OOK transmitter of claim 1, wherein the bi-phasing PA is configured to randomly change the phase of the buffered carrier between 0 degrees and 180 degrees every period of the transmission sequence, based on the control signal.

3. The OOK transmitter of claim 1, wherein the bi-phasing PA is configured to randomly change the phase of the buffered carrier between 0 degrees and 180 degrees in accordance with an element periodicity of the transmission sequence, based on the control signal.

4. The OOK transmitter of claim 1, wherein the bi-phasing PA is configured to randomly change the phase of the buffered carrier during the generating of the transmission signal of the transmission sequence.

* * * * *